US012562754B2

(12) United States Patent
Ivanov et al.

(10) Patent No.: US 12,562,754 B2
(45) Date of Patent: Feb. 24, 2026

(54) SINGLE-INDEX PARITY CHECK FOR POLAR ENCODING

(71) Applicant: QUALCOMM Incorporated, San Diego, CA (US)

(72) Inventors: Kirill Ivanov, La Jolla, CA (US); Wei Yang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 72 days.

(21) Appl. No.: 18/653,759

(22) Filed: May 2, 2024

(65) Prior Publication Data

US 2025/0343559 A1      Nov. 6, 2025

(51) Int. Cl.
H03M 13/13       (2006.01)
H03M 13/09       (2006.01)
H03M 13/11       (2006.01)

(52) U.S. Cl.
CPC .......... H03M 13/13 (2013.01); H03M 13/09 (2013.01); H03M 13/1108 (2013.01); H03M 13/1125 (2013.01)

(58) Field of Classification Search
CPC ............. H03M 13/09; H03M 13/1108; H03M 13/1125
See application file for complete search history.

(56) References Cited

U.S. PATENT DOCUMENTS

2017/0366204 A1*  12/2017  Shi ........................ H04L 25/061
2018/0097580 A1    4/2018  Zhang et al.

2018/0191459 A1     7/2018  Ge et al.
2018/0278272 A1*    9/2018  Li ......................... H04L 1/0061
2018/0331788 A1*   11/2018  Kim ....................... H04L 1/007
2019/0082435 A1*    3/2019  Noh ...................... H04B 7/0486
2019/0108093 A1*    4/2019  Presman .......... H03M 13/2906
2019/0356342 A1*   11/2019  Zhang .................. H04L 1/0061
2020/0028524 A1*    1/2020  Huang ................. H03M 13/13
2020/0344099 A1*   10/2020  Sahin ................... H04L 1/1607

FOREIGN PATENT DOCUMENTS

CN        115473537 A     12/2022
WO      2023156200 A1      8/2023

OTHER PUBLICATIONS

W. Li and Z. He, "An Efficient CRC-Aided Parity-Check Concatenated Polar Coding," 2021 IEEE Asia Conference on Information Engineering (ACIE), Sanya, China, 2021.*
T. Wang, D. Qu and T. Jiang, "Parity-Check-Concatenated Polar Codes," in IEEE Communications Letters, vol. 20, No. 12, pp. 2342-2345, Dec. 2016.*
International Search Report and Written Opinion—PCT/US2025/023626—ISA/EPO—Jun. 30, 2025.

* cited by examiner

*Primary Examiner* — Steve N Nguyen

(74) *Attorney, Agent, or Firm* — Harrity & Harrity, LLP

(57)          ABSTRACT

Various aspects of the present disclosure generally relate to wireless communication. In some aspects, a wireless communication device may encode a message using a polar encoding operation to generate an encoded communication, wherein the encoded communication includes one or more parity check symbols, wherein each parity check symbol of the one or more parity check symbols is derived from a respective single symbol of the encoded communication. The wireless communication device may transmit the encoded communication. Numerous other aspects are described.

23 Claims, 9 Drawing Sheets

610 — Encode a message using a polar encoding operation to generate an encoded communication, wherein the encoded communication includes one or more parity check symbols, wherein each parity check symbol of the one or more parity check symbols is derived from a respective single symbol of the encoded communication 620 — Transmit the encoded communication

600

710 — Receive an encoded communication

720 — Decode the encoded communication to obtain a message, wherein the encoded communication includes one or more parity check symbols, wherein each parity check symbol of the one or more parity check symbols is derived from a respective single symbol of the encoded communication

700

SINGLE-INDEX PARITY CHECK FOR POLAR ENCODING

FIELD OF THE DISCLOSURE

Aspects of the present disclosure generally relate to wireless communication and specifically relate to techniques, apparatuses, and methods for a single-index parity check for polar encoding.

BACKGROUND

Wireless communication systems are widely deployed to provide various services that may include carrying voice, text, messaging, video, data, and/or other traffic. The services may include unicast, multicast, and/or broadcast services, among other examples. Typical wireless communication systems may employ multiple-access radio access technologies (RATs) capable of supporting communication with multiple users by sharing available system resources (for example, time domain resources, frequency domain resources, spatial domain resources, and/or device transmit power, among other examples). Examples of such multiple-access RATs include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

The above multiple-access RATs have been adopted in various telecommunication standards to provide common protocols that enable different wireless communication devices to communicate on a municipal, national, regional, or global level. An example telecommunication standard is New Radio (NR). NR, which may also be referred to as 5G, is part of a continuous mobile broadband evolution promulgated by the Third Generation Partnership Project (3GPP). NR (and other mobile broadband evolutions beyond NR) may be designed to better support Internet of things (IoT) and reduced capability device deployments, industrial connectivity, millimeter wave (mmWave) expansion, licensed and unlicensed spectrum access, non-terrestrial network (NTN) deployment, sidelink and other device-to-device direct communication technologies (for example, cellular vehicle-to-everything (CV2X) communication), massive multiple-input multiple-output (MIMO), disaggregated network architectures and network topology expansions, multiple-subscriber implementations, high-precision positioning, and/or radio frequency (RF) sensing, among other examples. As the demand for mobile broadband access continues to increase, further improvements in NR may be implemented, and other radio access technologies such as 6G may be introduced, to further advance mobile broadband evolution.

SUMMARY

In some aspects, a method of wireless communication performed by a wireless communication device includes encoding a message using a polar encoding operation to generate an encoded communication, wherein the encoded communication includes one or more parity check symbols, wherein each parity check symbol of the one or more parity check symbols is derived from a respective single symbol of the encoded communication; and transmitting the encoded communication.

In some aspects, a method of wireless communication performed by a wireless communication device includes receiving an encoded communication; and decoding the encoded communication to obtain a message, wherein the encoded communication includes one or more parity check symbols, wherein each parity check symbol of the one or more parity check symbols is derived from a respective single symbol of the encoded communication.

In some aspects, an apparatus for wireless communication at a wireless communication device includes one or more memories; and one or more processors, coupled to the one or more memories, configured to cause the wireless communication device to: encode a message using a polar encoding operation to generate an encoded communication, wherein the encoded communication includes one or more parity check symbols, wherein each parity check symbol of the one or more parity check symbols is derived from a respective single symbol of the encoded communication; and transmit the encoded communication.

In some aspects, an apparatus for wireless communication at a wireless communication device includes one or more memories; and one or more processors, coupled to the one or more memories, configured to cause the wireless communication device to: receive an encoded communication; and decode the encoded communication to obtain a message, wherein the encoded communication includes one or more parity check symbols, wherein each parity check symbol of the one or more parity check symbols is derived from a respective single symbol of the encoded communication.

In some aspects, a non-transitory computer-readable medium storing a set of instructions for wireless communication includes one or more instructions that, when executed by one or more processors of a wireless communication device, cause the wireless communication device to: encode a message using a polar encoding operation to generate an encoded communication, wherein the encoded communication includes one or more parity check symbols, wherein each parity check symbol of the one or more parity check symbols is derived from a respective single symbol of the encoded communication; and transmit the encoded communication.

In some aspects, a non-transitory computer-readable medium storing a set of instructions for wireless communication includes one or more instructions that, when executed by one or more processors of a wireless communication device, cause the wireless communication device to: receive an encoded communication; and decode the encoded communication to obtain a message, wherein the encoded communication includes one or more parity check symbols, wherein each parity check symbol of the one or more parity check symbols is derived from a respective single symbol of the encoded communication.

In some aspects, an apparatus for wireless communication includes means for encoding a message using a polar encoding operation to generate an encoded communication, wherein the encoded communication includes one or more parity check symbols, wherein each parity check symbol of the one or more parity check symbols is derived from a respective single symbol of the encoded communication; and means for transmitting the encoded communication.

In some aspects, an apparatus for wireless communication includes means for receiving an encoded communication; and means for decoding the encoded communication to obtain a message, wherein the encoded communication includes one or more parity check symbols, wherein each parity check symbol of the one or more parity check symbols is derived from a respective single symbol of the encoded communication.

Aspects of the present disclosure may generally be implemented by or as a method, apparatus, system, computer program product, non-transitory computer-readable medium, user equipment, base station, network node, network entity, wireless communication device, and/or processing system as substantially described with reference to, and as illustrated by, the specification and accompanying drawings.

The foregoing paragraphs of this section have broadly summarized some aspects of the present disclosure. These and additional aspects and associated advantages will be described hereinafter. The disclosed aspects may be used as a basis for modifying or designing other aspects for carrying out the same or similar purposes of the present disclosure. Such equivalent aspects do not depart from the scope of the appended claims. Characteristics of the aspects disclosed herein, both their organization and method of operation, together with associated advantages, will be better understood from the following description when considered in connection with the accompanying drawings.

BRIEF DESCRIPTION OF THE DRAWINGS

The appended drawings illustrate some aspects of the present disclosure, but are not limiting of the scope of the present disclosure because the description may enable other aspects. Each of the drawings is provided for purposes of illustration and description, and not as a definition of the limits of the claims. The same or similar reference numbers in different drawings may identify the same or similar elements.

DETAILED DESCRIPTION

Figure 1:
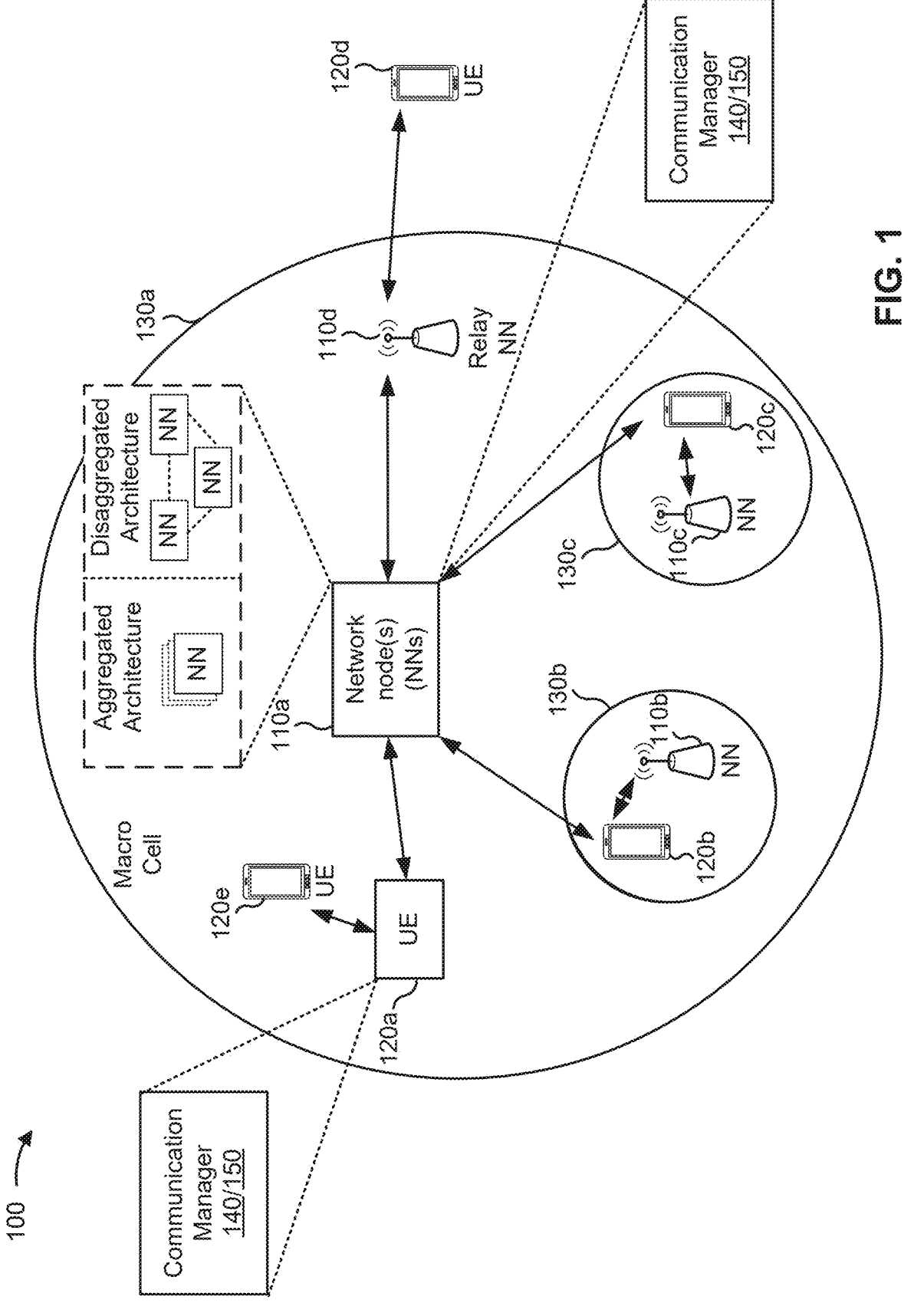
FIG. 1 is a diagram illustrating an example of a wireless communication network in accordance with the present disclosure.

Various aspects of the present disclosure are described hereinafter with reference to the accompanying drawings. However, aspects of the present disclosure may be embodied in many different forms and is not to be construed as limited to any specific aspect illustrated by or described with reference to an accompanying drawing or otherwise presented in this disclosure. Rather, these aspects are provided so that this disclosure will be thorough and complete, and will fully convey the scope of the disclosure to those skilled in the art. One skilled in the art may appreciate that the scope of the disclosure is intended to cover any aspect of the disclosure disclosed herein, whether implemented independently of or in combination with any other aspect of the disclosure. For example, an apparatus may be implemented or a method may be practiced using various combinations or quantities of the aspects set forth herein. In addition, the scope of the disclosure is intended to cover an apparatus having, or a method that is practiced using, other structures and/or functionalities in addition to or other than the structures and/or functionalities with which various aspects of the disclosure set forth herein may be practiced. Any aspect of the disclosure disclosed herein may be embodied by one or more elements of a claim.

Several aspects of telecommunication systems will now be presented with reference to various methods, operations, apparatuses, and techniques. These methods, operations, apparatuses, and techniques will be described in the following detailed description and illustrated in the accompanying drawings by various blocks, modules, components, circuits, steps, processes, or algorithms (collectively referred to as "elements"). These elements may be implemented using hardware, software, or a combination of hardware and software. Whether such elements are implemented as hardware or software depends upon the particular application and design constraints imposed on the overall system.

Wireless communications may use coding to improve wireless communication performance, such as by increasing reliability and throughput. For example, a transmitting device may encode a message and transmit an encoded communication carrying the message over a channel. A receiving device may decode the encoded communication to obtain the message. One form of coding is polar coding. Polar coding may use the polarization properties of the channel to improve reliability and efficiency. For example, a polar coding operation may generate an encoded communication including a plurality of symbols. Some symbols may carry information of a message and may be placed on information locations of the polar coding operation. An information location may correspond to a sub-channel that is associated with a high reliability, such as a sub-channel that is substantially noiseless. Other symbols of the plurality of symbols may be placed on frozen locations of the polar coding operation, and may carry a fixed value such as a zero value. In binary polar coding, each symbol carries a bit with one of two possible values. In non-binary polar coding, each symbol has one of N values, where N may be an integer greater than two. A code used to encode communications transmitted via a channel may be referred to as a channel code.

Some channel codes use parity checking techniques. Parity checking provides for error detection by including one or more parity checking bits in a communication. A parity checking bit may be derived from one or more other bits of the communication. This enables a receiving device to check whether a value of the parity checking bit is as expected based on the one or more other bits. If the one or more other bits are erroneously received, the value of the parity checking bit may differ from an expected value, enabling the receiving device to identify the error. Parity checking may be implemented in combination with polar coding. For example, a frozen symbol $u_i$ (that is, a symbol on a frozen location and with an index i) of an encoded communication may be used for parity checks, and may be derived from a set of other symbols of the encoded communication (where each symbol of the set of other symbols has a respective index denoted j and can be represented as $u_j$). Indexes of the set of other symbols may be selected from a set of indexes $S_i$ smaller than i. This can be represented as $$u_i = \Sigma_{j \in S_i} u_j,$$

where "$\Sigma$" denotes a derivation of $u_i$ from the set of other symbols (such as a sum operation, an exclusive-or operation, or the like).

While polar coding with parity checking may provide improvements in reliability and throughput, polar coding with parity check symbols derived from multiple other symbols may involve some amount of processing overhead, difficulty in detection at a receiving device, and/or message overhead. For example, if multiple parity check symbols are used, the receiving device may refer to multiple previously decoded information symbols, which involves processing overhead. As another example, a parity check symbol derived from multiple other symbols may have a structure that is associated with processing overhead at the decoding device, such as a complex structure. As another example, a parity check symbol derived from multiple other symbols may be associated with a multiple-bit cyclic redundancy check (CRC) (such as a CRC derived from both a list size of a decoder and a target false alarm rate), leading to some amount of message overhead (to carry the multiple-bit CRC) and processing overhead (to check the CRC for multiple paths at the decoder).

Aspects of the present disclosure relate generally to parity checking for polar coding. Some aspects more specifically relate to parity checking using a single-index constraint. Parity checking using a single-index constraint may mean that each parity check symbol ($u_i$) of an encoded communication is derived from only one corresponding symbol ($u_j$). As one example, this can be represented as $u_i = u_j$, though in some aspects, the parity check symbol may not be equal to the corresponding symbol. In some aspects, each parity check symbol may be separated from each corresponding symbol by a fixed shift (e.g., the same shift). For example, the fixed shift may be co-prime with a value defining a number of bits of the encoded communication. In some aspects, an encoded communication may include a shortened CRC value. For example, the encoded communication may include a CRC value with a CRC length that is derived only from a target false alarm rate (as opposed to a CRC value with a CRC length derived from the target false alarm rate and a list size of the decoder). A receiving device (e.g., a decoder) may perform a CRC check using the CRC value. For example, the receiving device may decode the encoded communication by selecting a path (of multiple paths, such as for successive cancellation list decoding) according to a path metric, and performing a CRC check for only the selected path using the CRC value.

Particular aspects of the subject matter described in this disclosure can be implemented to realize one or more of the following potential advantages. In some examples, by encoding communications and performing parity checking using a single-index constraint, the described techniques can be used to simplify processing at the receiving device and decoding (by providing a simpler structure than multiplesymbol-index parity check symbols). Furthermore, by using the fixed shift between parity check symbols and corresponding other symbols, structure is simplified and processing at the receiving device is simplified. By using a fixed shift that is co-prime with a value defining a number of bits of the encoded communication, performance is improved. By using the shortened CRC value, decoding performance at the receiver is improved. For example, using single-index constraint parity check symbols may provide acceptable error correction performance by selecting a best path from a list according to a path metric without performing CRC checks for a plurality of paths. In this example, the receiving device may perform the CRC check only for the selected best path and not a remainder of the plurality of paths. Thus, message overhead may be reduced, relative to including a CRC that facilitates error correction for each of the plurality of paths, and processing resource usage at the receiving device may be reduced. Furthermore, single-index parity check symbol usage may provide substantially similar signal-to-noise ratio performance in comparison to multiple-index parity check symbol usage.

Multiple-access radio access technologies (RATs) have been adopted in various telecommunication standards to provide common protocols that enable wireless communication devices to communicate on a municipal, enterprise, national, regional, or global level. For example, 5G New Radio (NR) is part of a continuous mobile broadband evolution promulgated by the Third Generation Partnership Project (3GPP). 5G NR supports various technologies and use cases including enhanced mobile broadband (eMBB), ultra-reliable low-latency communication (URLLC), massive machine-type communication (mMTC), millimeter wave (mmWave) technology, beamforming, network slicing, edge computing, Internet of Things (IoT) connectivity and management, and network function virtualization (NFV).

As the demand for broadband access increases and as technologies supported by wireless communication networks evolve, further technological improvements may be adopted in or implemented for 5G NR or future RATs, such as 6G, to further advance the evolution of wireless communication for a wide variety of existing and new use cases and applications. Such technological improvements may be associated with new frequency band expansion, licensed and unlicensed spectrum access, overlapping spectrum use, small cell deployments, non-terrestrial network (NTN) deployments, disaggregated network architectures and network topology expansion, device aggregation, advanced duplex communication, sidelink and other device-to-device direct communication, IoT (including passive or ambient IoT) networks, reduced capability (RedCap) UE functionality, industrial connectivity, multiple-subscriber implementations, high-precision positioning, radio frequency (RF) sensing, and/or artificial intelligence or machine learning (AI/ML), among other examples. These technological improvements may support use cases such as wireless backhauls, wireless data centers, extended reality (XR) and metaverse applications, meta services for supporting vehicle connectivity, holographic and mixed reality communication, autonomous and collaborative robots, vehicle platooning and cooperative maneuvering, sensing networks, gesture monitoring, human-brain interfacing, digital twin applications, asset management, and universal coverage applications using non-terrestrial and/or aerial platforms, among other examples. The methods, operations, apparatuses, and techniques described herein may enable one or more of the foregoing technologies and/or support one or more of the foregoing use cases.

FIG. 1 is a diagram illustrating an example of a wireless communication network 100 in accordance with the present disclosure. The wireless communication network 100 may be or may include elements of a 5G (or NR) network or a 6G network, among other examples. The wireless communication network 100 may include multiple network nodes 110, shown as a network node (NN) 110a, a network node 110b, a network node 110c, and a network node 110d. The network nodes 110 may support communications with multiple UEs 120, shown as a UE 120a, a UE 120b, a UE 120c, a UE 120d, and a UE 120e.

The network nodes 110 and the UEs 120 of the wireless communication network 100 may communicate using the electromagnetic spectrum, which may be subdivided by frequency or wavelength into various classes, bands, carriers, and/or channels. For example, devices of the wireless communication network 100 may communicate using one or more operating bands. In some aspects, multiple wireless communication networks 100 may be deployed in a given geographic area. Each wireless communication network 100 may support a particular RAT (which may also be referred to as an air interface) and may operate on one or more carrier frequencies in one or more frequency ranges. Examples of RATs include a 4G RAT, a 5G/NR RAT, and/or a 6G RAT, among other examples. In some examples, when multiple RATs are deployed in a given geographic area, each RAT in the geographic area may operate on different frequencies to avoid interference with one another.

Various operating bands have been defined as frequency range designations FR1 (410 MHz through 7.125 GHz), FR2 (24.25 GHz through 52.6 GHz), FR3 (7.125 GHz through 24.25 GHz), FR4a or FR4-1 (52.6 GHz through 71 GHz), FR4 (52.6 GHz through 114.25 GHz), and FR5 (114.25 GHz through 300 GHz). Although a portion of FR1 is greater than 6 GHz, FR1 is often referred to (interchangeably) as a "Sub-6 GHz" band in some documents and articles. Similarly, FR2 is often referred to (interchangeably) as a "millimeter wave" band in some documents and articles, despite being different than the extremely high frequency (EHF) band (30 GHz through 300 GHz), which is identified by the International Telecommunications Union (ITU) as a "millimeter wave" band. The frequencies between FR1 and FR2 are often referred to as mid-band frequencies, which include FR3. Frequency bands falling within FR3 may inherit FR1 characteristics or FR2 characteristics, and thus may effectively extend features of FR1 or FR2 into mid-band frequencies. Thus, "sub-6 GHz," if used herein, may broadly refer to frequencies that are less than 6 GHz, that are within FR1, and/or that are included in mid-band frequencies. Similarly, the term "millimeter wave," if used herein, may broadly refer to frequencies that are included in mid-band frequencies, that are within FR2, FR4, FR4-a or FR4-1, or FR5, and/or that are within the EHF band. Higher frequency bands may extend 5G NR operation, 6G operation, and/or other RATs beyond 52.6 GHz. For example, each of FR4a, FR4-1, FR4, and FR5 falls within the EHF band. In some examples, the wireless communication network 100 may implement dynamic spectrum sharing (DSS), in which multiple RATs (for example, 4G/LTE and 5G/NR) are implemented with dynamic bandwidth allocation (for example, based on user demand) in a single frequency band. It is contemplated that the frequencies included in these operating bands (for example, FR1, FR2, FR3, FR4, FR4-a, FR4-1, and/or FR5) may be modified, and techniques described herein may be applicable to those modified frequency ranges.

A network node 110 may include one or more devices, components, or systems that enable communication between a UE 120 and one or more devices, components, or systems of the wireless communication network 100. A network node 110 may be, may include, or may also be referred to as an NR network node, a 5G network node, a 6G network node, a Node B, an eNB, a gNB, an access point (AP), a transmission reception point (TRP), a mobility element, a core, a network entity, a network element, a network equipment, and/or another type of device, component, or system included in a radio access network (RAN).

A network node 110 may be implemented as a single physical node (for example, a single physical structure) or may be implemented as two or more physical nodes (for example, two or more distinct physical structures). For example, a network node 110 may be a device or system that implements part of a radio protocol stack, a device or system that implements a full radio protocol stack (such as a full gNB protocol stack), or a collection of devices or systems that collectively implement the full radio protocol stack. For example, and as shown, a network node 110 may be an aggregated network node (having an aggregated architecture), meaning that the network node 110 may implement a full radio protocol stack that is physically and logically integrated within a single node (for example, a single physical structure) in the wireless communication network 100. For example, an aggregated network node 110 may consist of a single standalone base station or a single TRP that uses a full radio protocol stack to enable or facilitate communication between a UE 120 and a core network of the wireless communication network 100.

Alternatively, and as also shown, a network node 110 may be a disaggregated network node (sometimes referred to as a disaggregated base station), meaning that the network node 110 may implement a radio protocol stack that is physically distributed and/or logically distributed among two or more nodes in the same geographic location or in different geographic locations. For example, a disaggregated network node may have a disaggregated architecture. In some deployments, disaggregated network nodes 110 may be used in an integrated access and backhaul (IAB) network, in an open radio access network (O-RAN) (such as a network configuration in compliance with the O-RAN Alliance), or in a virtualized radio access network (vRAN), also known as a cloud radio access network (C-RAN), to facilitate scaling by separating base station functionality into multiple units that can be individually deployed.

The network nodes 110 of the wireless communication network 100 may include one or more central units (CUs), one or more distributed units (DUs), and/or one or more radio units (RUs). A CU may host one or more higher layer control functions, such as radio resource control (RRC) functions, packet data convergence protocol (PDCP) functions, and/or service data adaptation protocol (SDAP) functions, among other examples. A DU may host one or more of a radio link control (RLC) layer, a medium access control (MAC) layer, and/or one or more higher physical (PHY) layers depending, at least in part, on a functional split, such as a functional split defined by the 3GPP. In some examples, a DU also may host one or more lower PHY layer functions, such as a fast Fourier transform (FFT), an inverse FFT (iFFT), beamforming, physical random access channel (PRACH) extraction and filtering, and/or scheduling of resources for one or more UEs 120, among other examples.

An RU may host RF processing functions or lower PHY layer functions, such as an FFT, an iFFT, beamforming, or PRACH extraction and filtering, among other examples, according to a functional split, such as a lower layer functional split. In such an architecture, each RU can be operated to handle over the air (OTA) communication with one or more UEs 120.

In some aspects, a single network node 110 may include a combination of one or more CUs, one or more DUs, and/or one or more RUs. Additionally or alternatively, a network node 110 may include one or more Near-Real Time (Near-RT) RAN Intelligent Controllers (RICs) and/or one or more Non-Real Time (Non-RT) RICs. In some examples, a CU, a DU, and/or an RU may be implemented as a virtual unit, such as a virtual central unit (VCU), a virtual distributed unit (VDU), or a virtual radio unit (VRU), among other examples. A virtual unit may be implemented as a virtual network function, such as associated with a cloud deployment.

Some network nodes 110 (for example, a base station, an RU, or a TRP) may provide communication coverage for a particular geographic area. In the 3GPP, the term "cell" can refer to a coverage area of a network node 110 or to a network node 110 itself, depending on the context in which the term is used. A network node 110 may support one or multiple (for example, three) cells. In some examples, a network node 110 may provide communication coverage for a macro cell, a pico cell, a femto cell, or another type of cell. A macro cell may cover a relatively large geographic area (for example, several kilometers in radius) and may allow unrestricted access by UEs 120 with service subscriptions. A pico cell may cover a relatively small geographic area and may allow unrestricted access by UEs 120 with service subscriptions. A femto cell may cover a relatively small geographic area (for example, a home) and may allow restricted access by UEs 120 having association with the femto cell (for example, UEs 120 in a closed subscriber group (CSG)). A network node 110 for a macro cell may be referred to as a macro network node. A network node 110 for a pico cell may be referred to as a pico network node. A network node 110 for a femto cell may be referred to as a femto network node or an in-home network node. In some examples, a cell may not necessarily be stationary. For example, the geographic area of the cell may move according to the location of an associated mobile network node 110 (for example, a train, a satellite base station, an unmanned aerial vehicle, or an NTN network node).

The wireless communication network 100 may be a heterogeneous network that includes network nodes 110 of different types, such as macro network nodes, pico network nodes, femto network nodes, relay network nodes, aggregated network nodes, and/or disaggregated network nodes, among other examples. In the example shown in FIG. 1, the network node 110a may be a macro network node for a macro cell 130a, the network node 110b may be a pico network node for a pico cell 130b, and the network node 110c may be a femto network node for a femto cell 130c. Various different types of network nodes 110 may generally transmit at different power levels, serve different coverage areas, and/or have different impacts on interference in the wireless communication network 100 than other types of network nodes 110. For example, macro network nodes may have a high transmit power level (for example, 5 to 40 watts), whereas pico network nodes, femto network nodes, and relay network nodes may have lower transmit power levels (for example, 0.1 to 2 watts).

In some examples, a network node 110 may be, may include, or may operate as an RU, a TRP, or a base station that communicates with one or more UEs 120 via a radio access link (which may be referred to as a "Uu" link). The radio access link may include a downlink and an uplink. "Downlink" (or "DL") refers to a communication direction from a network node 110 to a UE 120, and "uplink" (or "UL") refers to a communication direction from a UE 120 to a network node 110. Downlink channels may include one or more control channels and one or more data channels. A downlink control channel may be used to transmit downlink control information (DCI) (for example, scheduling information, reference signals, and/or configuration information) from a network node 110 to a UE 120. A downlink data channel may be used to transmit downlink data (for example, user data associated with a UE 120) from a network node 110 to a UE 120. Downlink control channels may include one or more physical downlink control channels (PDCCHs), and downlink data channels may include one or more physical downlink shared channels (PDSCHs). Uplink channels may similarly include one or more control channels and one or more data channels. An uplink control channel may be used to transmit uplink control information (UCI) (for example, reference signals and/or feedback corresponding to one or more downlink transmissions) from a UE 120 to a network node 110. An uplink data channel may be used to transmit uplink data (for example, user data associated with a UE 120) from a UE 120 to a network node 110. Uplink control channels may include one or more physical uplink control channels (PUCCHs), and uplink data channels may include one or more physical uplink shared channels (PUSCHs). The downlink and the uplink may each include a set of resources on which the network node 110 and the UE 120 may communicate.

Downlink and uplink resources may include time domain resources (frames, subframes, slots, and/or symbols), frequency domain resources (frequency bands, component carriers, subcarriers, resource blocks, and/or resource elements), and/or spatial domain resources (particular transmit directions and/or beam parameters). Frequency domain resources of some bands may be subdivided into bandwidth parts (BWPs). A BWP may be a continuous block of frequency domain resources (for example, a continuous block of resource blocks) that are allocated for one or more UEs 120. A UE 120 may be configured with both an uplink BWP and a downlink BWP (where the uplink BWP and the downlink BWP may be the same BWP or different BWPs). A BWP may be dynamically configured (for example, by a network node 110 transmitting a DCI configuration to the one or more UEs 120) and/or reconfigured, which means that a BWP can be adjusted in real-time (or near-real-time) based on changing network conditions in the wireless communication network 100 and/or based on the specific requirements of the one or more UEs 120. This enables more efficient use of the available frequency domain resources in the wireless communication network 100 because fewer frequency domain resources may be allocated to a BWP for a UE 120 (which may reduce the quantity of frequency domain resources that a UE 120 is required to monitor), leaving more frequency domain resources to be spread across multiple UEs 120. Thus, BWPs may also assist in the implementation of lower-capability UEs 120 by facilitating the configuration of smaller bandwidths for communication by such UEs 120.

As described above, in some aspects, the wireless communication network 100 may be, may include, or may be included in, an IAB network. In an IAB network, at least one network node 110 is an anchor network node that communicates with a core network. An anchor network node 110 may also be referred to as an IAB donor (or "IAB-donor"). The anchor network node 110 may connect to the core network via a wired backhaul link. For example, an Ng interface of the anchor network node 110 may terminate at the core network. Additionally or alternatively, an anchor network node 110 may connect to one or more devices of the core network that provide a core access and mobility management function (AMF). An IAB network also generally includes multiple non-anchor network nodes 110, which may also be referred to as relay network nodes or simply as IAB nodes (or "IAB-nodes"). Each non-anchor network node 110 may communicate directly with the anchor network node 110 via a wireless backhaul link to access the core network, or may communicate indirectly with the anchor network node 110 via one or more other non-anchor network nodes 110 and associated wireless backhaul links that form a backhaul path to the core network. Some anchor network node 110 or other non-anchor network node 110 may also communicate directly with one or more UEs 120 via wireless access links that carry access traffic. In some examples, network resources for wireless communication (such as time resources, frequency resources, and/or spatial resources) may be shared between access links and backhaul links.

In some examples, any network node 110 that relays communications may be referred to as a relay network node, a relay station, or simply as a relay. A relay may receive a transmission of a communication from an upstream station (for example, another network node 110 or a UE 120) and transmit the communication to a downstream station (for example, a UE 120 or another network node 110). In this case, the wireless communication network 100 may include or be referred to as a "multi-hop network." In the example shown in FIG. 1, the network node 110d (for example, a relay network node) may communicate with the network node 110a (for example, a macro network node) and the UE 120d in order to facilitate communication between the network node 110a and the UE 120d. Additionally or alternatively, a UE 120 may be or may operate as a relay station that can relay transmissions to or from other UEs 120. A UE 120 that relays communications may be referred to as a UE relay or a relay UE, among other examples.

The UEs 120 may be physically dispersed throughout the wireless communication network 100, and each UE 120 may be stationary or mobile. A UE 120 may be, may include, or may be included in an access terminal, another terminal, a mobile station, or a subscriber unit. A UE 120 may be, include, or be coupled with a cellular phone (for example, a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device, a biometric device, a wearable device (for example, a smart watch, smart clothing, smart glasses, a smart wristband, and/or smart jewelry, such as a smart ring or a smart bracelet), an entertainment device (for example, a music device, a video device, and/or a satellite radio), an XR device, a vehicular component or sensor, a smart meter or sensor, industrial manufacturing equipment, a Global Navigation Satellite System (GNSS) device (such as a Global Positioning System device or another type of positioning device), a UE function of a network node, and/or any other suitable device or function that may communicate via a wireless medium.

A UE 120 and/or a network node 110 may include one or more chips, system-on-chips (SoCs), chipsets, packages, or devices that individually or collectively constitute or comprise a processing system. The processing system includes processor (or "processing") circuitry in the form of one or multiple processors, microprocessors, processing units (such as central processing units (CPUs), graphics processing units (GPUs), neural processing units (NPUs) and/or digital signal processors (DSPs)), processing blocks, application-specific integrated circuits (ASIC), programmable logic devices (PLDs) (such as field programmable gate arrays (FPGAs)), or other discrete gate or transistor logic or circuitry (all of which may be generally referred to herein individually as "processors" or collectively as "the processor" or "the processor circuitry"). One or more of the processors may be individually or collectively configurable or configured to perform various functions or operations described herein. A group of processors collectively configurable or configured to perform a set of functions may include a first processor configurable or configured to perform a first function of the set and a second processor configurable or configured to perform a second function of the set, or may include the group of processors all being configured or configurable to perform the set of functions.

The processing system may further include memory circuitry in the form of one or more memory devices, memory blocks, memory elements or other discrete gate or transistor logic or circuitry, each of which may include tangible storage media such as random-access memory (RAM) or read-only memory (ROM), or combinations thereof (all of which may be generally referred to herein individually as "memories" or collectively as "the memory" or "the memory circuitry"). One or more of the memories may be coupled (for example, operatively coupled, communicatively coupled, electronically coupled, or electrically coupled) with one or more of the processors and may individually or collectively store processor-executable code (such as software) that, when executed by one or more of the processors, may configure one or more of the processors to perform various functions or operations described herein. Additionally or alternatively, in some examples, one or more of the processors may be preconfigured to perform various functions or operations described herein without requiring configuration by software. The processing system may further include or be coupled with one or more modems (such as a Wi-Fi (for example, IEEE compliant) modem or a cellular (for example, 3GPP 4G LTE, 5G, or 6G compliant) modem). In some implementations, one or more processors of the processing system include or implement one or more of the modems. The processing system may further include or be coupled with multiple radios (collectively "the radio"), multiple RF chains, or multiple transceivers, each of which may in turn be coupled with one or more of multiple antennas. In some implementations, one or more processors of the processing system include or implement one or more of the radios, RF chains or transceivers. The UE 120 may include or may be included in a housing that houses components associated with the UE 120 including the processing system.

Some UEs 120 may be considered machine-type communication (MTC) UEs, evolved or enhanced machine-type communication (eMTC), UEs, further enhanced eMTC (feMTC) UEs, or enhanced feMTC (efeMTC) UEs, or further evolutions thereof, all of which may be simply referred to as "MTC UEs"). An MTC UE may be, may include, or may be included in or coupled with a robot, an uncrewed aerial vehicle, a remote device, a sensor, a meter, a monitor, and/or a location tag. Some UEs 120 may be considered IoT devices and/or may be implemented as NB-IoT (narrowband IoT) devices. An IoT UE or NB-IoT device may be, may include, or may be included in or coupled with an industrial machine, an appliance, a refrigerator, a doorbell camera device, a home automation device, and/or a light fixture, among other examples. Some UEs 120 may be considered Customer Premises Equipment, which may include telecommunications devices that are installed at a customer location (such as a home or office) to enable access to a service provider's network (such as included in or in communication with the wireless communication network 100).

Some UEs 120 may be classified according to different categories in association with different complexities and/or different capabilities. UEs 120 in a first category may facilitate massive IoT in the wireless communication network 100, and may offer low complexity and/or cost relative to UEs 120 in a second category. UEs 120 in a second category may include mission-critical IoT devices, legacy UEs, baseline UEs, high-tier UEs, advanced UEs, full-capability UEs, and/or premium UEs that are capable of URLLC, enhanced mobile broadband (eMBB), and/or precise positioning in the wireless communication network 100, among other examples. A third category of UEs 120 may have mid-tier complexity and/or capability (for example, a capability between UEs 120 of the first category and UEs 120 of the second capability). A UE 120 of the third category may be referred to as a reduced capacity UE ("RedCap UE"), a mid-tier UE, an NR-Light UE, and/or an NR-Lite UE, among other examples. RedCap UEs may bridge a gap between the capability and complexity of NB-IoT devices and/or eMTC UEs, and mission-critical IoT devices and/or premium UEs. RedCap UEs may include, for example, wearable devices, IoT devices, industrial sensors, and/or cameras that are associated with a limited bandwidth, power capacity, and/or transmission range, among other examples. RedCap UEs may support healthcare environments, building automation, electrical distribution, process automation, transport and logistics, and/or smart city deployments, among other examples.

In some examples, two or more UEs 120 (for example, shown as UE 120a and UE 120e) may communicate directly with one another using sidelink communications (for example, without communicating by way of a network node 110 as an intermediary). As an example, the UE 120a may directly transmit data, control information, or other signaling as a sidelink communication to the UE 120e. This is in contrast to, for example, the UE 120a first transmitting data in an UL communication to a network node 110, which then transmits the data to the UE 120e in a DL communication. In various examples, the UEs 120 may transmit and receive sidelink communications using peer-to-peer (P2P) communication protocols, device-to-device (D2D) communication protocols, vehicle-to-everything (V2X) communication protocols (which may include vehicle-to-vehicle (V2V) protocols, vehicle-to-infrastructure (V2I) protocols, and/or vehicle-to-pedestrian (V2P) protocols), and/or mesh network communication protocols. In some deployments and configurations, a network node 110 may schedule and/or allocate resources for sidelink communications between UEs 120 in the wireless communication network 100. In some other deployments and configurations, a UE 120 (instead of a network node 110) may perform, or collaborate or negotiate with one or more other UEs to perform, scheduling operations, resource selection operations, and/or other operations for sidelink communications.

In various examples, some of the network nodes 110 and the UEs 120 of the wireless communication network 100 may be configured for full-duplex operation in addition to half-duplex operation. A network node 110 or a UE 120 operating in a half-duplex mode may perform only one of transmission or reception during particular time resources, such as during particular slots, symbols, or other time periods. Half-duplex operation may involve time-division duplexing (TDD), in which DL transmissions of the network node 110 and UL transmissions of the UE 120 do not occur in the same time resources (that is, the transmissions do not overlap in time). In contrast, a network node 110 or a UE 120 operating in a full-duplex mode can transmit and receive communications concurrently (for example, in the same time resources). By operating in a full-duplex mode, network nodes 110 and/or UEs 120 may generally increase the capacity of the network and the radio access link. In some examples, full-duplex operation may involve frequency-division duplexing (FDD), in which DL transmissions of the network node 110 are performed in a first frequency band or on a first component carrier and transmissions of the UE 120 are performed in a second frequency band or on a second component carrier different than the first frequency band or the first component carrier, respectively. In some examples, full-duplex operation may be enabled for a UE 120 but not for a network node 110. For example, a UE 120 may simultaneously transmit an UL transmission to a first network node 110 and receive a DL transmission from a second network node 110 in the same time resources. In some other examples, full-duplex operation may be enabled for a network node 110 but not for a UE 120. For example, a network node 110 may simultaneously transmit a DL transmission to a first UE 120 and receive an UL transmission from a second UE 120 in the same time resources. In some other examples, full-duplex operation may be enabled for both a network node 110 and a UE 120.

In some examples, the UEs 120 and the network nodes 110 may perform MIMO communication. "MIMO" generally refers to transmitting or receiving multiple signals (such as multiple layers or multiple data streams) simultaneously over the same time and frequency resources. MIMO techniques generally exploit multipath propagation. MIMO may be implemented using various spatial processing or spatial multiplexing operations. In some examples, MIMO may support simultaneous transmission to multiple receivers, referred to as multi-user MIMO (MU-MIMO). Some RATs may employ advanced MIMO techniques, such as mTRP operation (including redundant transmission or reception on multiple TRPs), reciprocity in the time domain or the frequency domain, single-frequency-network (SFN) transmission, or non-coherent joint transmission (NC-JT).

In some aspects, a UE 120 or a network node 110 may include a communication manager 140. As described in more detail elsewhere herein, the communication manager 140 may encode a message using a polar encoding operation to generate an encoded communication, wherein the encoded communication includes one or more parity check symbols, wherein each parity check symbol of the one or more parity check symbols is derived from a respective single symbol of the encoded communication; and transmit the encoded communication. Additionally, or alternatively, the communication manager 140 may perform one or more other operations described herein.

In some aspects, a UE 120 or a network node 110 may include a communication manager 150. As described in more detail elsewhere herein, the communication manager 150 may receive an encoded communication; and decode the encoded communication to obtain a message, wherein the encoded communication includes one or more parity check symbols, wherein each parity check symbol of the one or more parity check symbols is derived from a respective single symbol of the encoded communication. Additionally, or alternatively, the communication manager 150 may perform one or more other operations described herein.

As indicated above, FIG. 1 is provided as an example. Other examples may differ from what is described with regard to FIG. 1.

Figure 2:
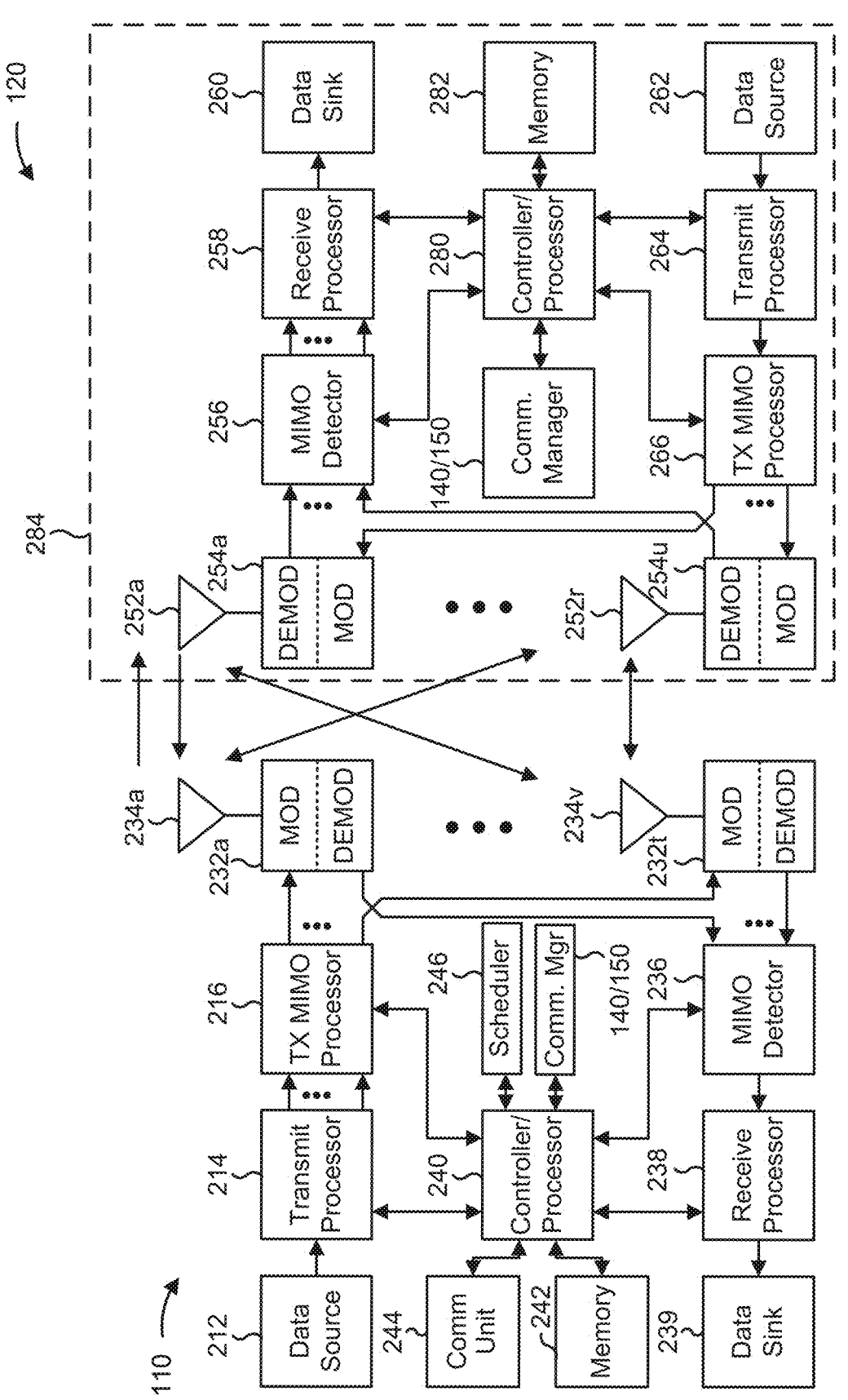
FIG. 2 is a diagram illustrating an example network node in communication with an example user equipment (UE) in a wireless network in accordance with the present disclosure.

FIG. 2 is a diagram illustrating an example network node 110 in communication with an example UE 120 in a wireless network in accordance with the present disclosure.

As shown in FIG. 2, the network node 110 may include a data source 212, a transmit processor 214, a transmit (TX) MIMO processor 216, a set of modems 232 (shown as 232a through 232t, where t≥1), a set of antennas 234 (shown as 234a through 234v, where v≥1), a MIMO detector 236, a receive processor 238, a data sink 239, a controller/processor 240, a memory 242, a communication unit 244, a scheduler 246, and/or a communication manager 150, among other examples. In some configurations, one or a combination of the antenna(s) 234, the modem(s) 232, the MIMO detector 236, the receive processor 238, the transmit processor 214, and/or the TX MIMO processor 216 may be included in a transceiver of the network node 110. The transceiver may be under control of and used by one or more processors, such as the controller/processor 240, and in some aspects in conjunction with processor-readable code stored in the memory 242, to perform aspects of the methods, processes, and/or operations described herein. In some aspects, the network node 110 may include one or more interfaces, communication components, and/or other components that facilitate communication with the UE 120 or another network node.

The terms "processor," "controller," or "controller/processor" may refer to one or more controllers and/or one or more processors. For example, reference to "a/the processor," "a/the controller/processor," or the like (in the singular) should be understood to refer to any one or more of the processors described in connection with FIG. 2, such as a single processor or a combination of multiple different processors. Reference to "one or more processors" should be understood to refer to any one or more of the processors described in connection with FIG. 2. For example, one or more processors of the network node 110 may include transmit processor 214, TX MIMO processor 216, MIMO detector 236, receive processor 238, and/or controller/processor 240. Similarly, one or more processors of the UE 120 may include MIMO detector 256, receive processor 258, transmit processor 264, TX MIMO processor 266, and/or controller/processor 280.

In some aspects, a single processor may perform all of the operations described as being performed by the one or more processors. In some aspects, a first set of (one or more) processors of the one or more processors may perform a first operation described as being performed by the one or more processors, and a second set of (one or more) processors of the one or more processors may perform a second operation described as being performed by the one or more processors. The first set of processors and the second set of processors may be the same set of processors or may be different sets of processors. Reference to "one or more memories" should be understood to refer to any one or more memories of a corresponding device, such as the memory described in connection with FIG. 2. For example, operation described as being performed by one or more memories can be performed by the same subset of the one or more memories or different subsets of the one or more memories.

For downlink communication from the network node 110 to the UE 120, the transmit processor 214 may receive data ("downlink data") intended for the UE 120 (or a set of UEs that includes the UE 120) from the data source 212 (such as a data pipeline or a data queue). In some examples, the transmit processor 214 may select one or more MCSs for the UE 120 in accordance with one or more channel quality indicators (CQIs) received from the UE 120. The network node 110 may process the data (for example, including encoding the data) for transmission to the UE 120 on a downlink in accordance with the MCS(s) selected for the UE 120 to generate data symbols. The transmit processor 214 may process system information (for example, semi-static resource partitioning information (SRPI)) and/or control information (for example, CQI requests, grants, and/or upper layer signaling) and provide overhead symbols and/or control symbols. The transmit processor 214 may generate reference symbols for reference signals (for example, a cell-specific reference signal (CRS), a demodulation reference signal (DMRS), or a channel state information (CSI) reference signal (CSI-RS)) and/or synchronization signals (for example, a primary synchronization signal (PSS) or a secondary synchronization signals (SSS)).

The TX MIMO processor 216 may perform spatial processing (for example, precoding) on the data symbols, the control symbols, the overhead symbols, and/or the reference symbols, if applicable, and may provide a set of output symbol streams (for example, T output symbol streams) to the set of modems 232. For example, each output symbol stream may be provided to a respective modulator component (shown as MOD) of a modem 232. Each modem 232 may use the respective modulator component to process (for example, to modulate) a respective output symbol stream (for example, for orthogonal frequency division multiplexing (OFDM)) to obtain an output sample stream. Each modem 232 may further use the respective modulator component to process (for example, convert to analog, amplify, filter, and/or upconvert) the output sample stream to obtain a time domain downlink signal. The modems 232a through 232t may together transmit a set of downlink signals (for example, T downlink signals) via the corresponding set of antennas 234.

A downlink signal may include a DCI communication, a MAC control element (MAC-CE) communication, an RRC communication, a downlink reference signal, or another type of downlink communication. Downlink signals may be transmitted on a PDCCH, a PDSCH, and/or on another downlink channel. A downlink signal may carry one or more transport blocks (TBs) of data. A TB may be a unit of data that is transmitted over an air interface in the wireless communication network 100. A data stream (for example, from the data source 212) may be encoded into multiple TBs for transmission over the air interface. The quantity of TBs used to carry the data associated with a particular data stream may be associated with a TB size common to the multiple TBs. The TB size may be based on or otherwise associated with radio channel conditions of the air interface, the MCS used for encoding the data, the downlink resources allocated for transmitting the data, and/or another parameter. In general, the larger the TB size, the greater the amount of data that can be transmitted in a single transmission, which reduces signaling overhead. However, larger TB sizes may be more prone to transmission and/or reception errors than smaller TB sizes, but such errors may be mitigated by more robust error correction techniques.

For uplink communication from the UE 120 to the network node 110, uplink signals from the UE 120 may be received by an antenna 234, may be processed by a modem 232 (for example, a demodulator component, shown as DEMOD, of a modem 232), may be detected by the MIMO detector 236 (for example, a receive (Rx) MIMO processor) if applicable, and/or may be further processed by the receive processor 238 to obtain decoded data and/or control information. The receive processor 238 may provide the decoded data to a data sink 239 (which may be a data pipeline, a data queue, and/or another type of data sink) and provide the decoded control information to a processor, such as the controller/processor 240.

The network node 110 may use the scheduler 246 to schedule one or more UEs 120 for downlink or uplink communications. In some aspects, the scheduler 246 may use DCI to dynamically schedule DL transmissions to the UE 120 and/or UL transmissions from the UE 120. In some examples, the scheduler 246 may allocate recurring time domain resources and/or frequency domain resources that the UE 120 may use to transmit and/or receive communications using an RRC configuration (for example, a semi-static configuration), for example, to perform semi-persistent scheduling (SPS) or to configure a configured grant (CG) for the UE 120.

One or more of the transmit processor 214, the TX MIMO processor 216, the modem 232, the antenna 234, the MIMO detector 236, the receive processor 238, and/or the controller/processor 240 may be included in an RF chain of the network node 110. An RF chain may include one or more filters, mixers, oscillators, amplifiers, analog-to-digital converters (ADCs), and/or other devices that convert between an analog signal (such as for transmission or reception via an air interface) and a digital signal (such as for processing by one or more processors of the network node 110). In some aspects, the RF chain may be or may be included in a transceiver of the network node 110.

In some examples, the network node 110 may use the communication unit 244 to communicate with a core network and/or with other network nodes. The communication unit 244 may support wired and/or wireless communication protocols and/or connections, such as Ethernet, optical fiber, common public radio interface (CPRI), and/or a wired or wireless backhaul, among other examples. The network node 110 may use the communication unit 244 to transmit and/or receive data associated with the UE 120 or to perform network control signaling, among other examples. The communication unit 244 may include a transceiver and/or an interface, such as a network interface.

The UE 120 may include a set of antennas 252 (shown as antennas 252a through 252r, where r≥1), a set of modems 254 (shown as modems 254a through 254u, where u≥1), a MIMO detector 256, a receive processor 258, a data sink 260, a data source 262, a transmit processor 264, a TX MIMO processor 266, a controller/processor 280, a memory 282, and/or a communication manager 140, among other examples. One or more of the components of the UE 120 may be included in a housing 284. In some aspects, one or a combination of the antenna(s) 252, the modem(s) 254, the MIMO detector 256, the receive processor 258, the transmit processor 264, or the TX MIMO processor 266 may be included in a transceiver that is included in the UE 120. The transceiver may be under control of and used by one or more processors, such as the controller/processor 280, and in some aspects in conjunction with processor-readable code stored in the memory 282, to perform aspects of the methods, processes, or operations described herein. In some aspects, the UE 120 may include another interface, another communication component, and/or another component that facilitates communication with the network node 110 and/or another UE 120.

For downlink communication from the network node 110 to the UE 120, the set of antennas 252 may receive the downlink communications or signals from the network node 110 and may provide a set of received downlink signals (for example, R received signals) to the set of modems 254. For example, each received signal may be provided to a respective demodulator component (shown as DEMOD) of a modem 254. Each modem 254 may use the respective demodulator component to condition (for example, filter, amplify, downconvert, and/or digitize) a received signal to obtain input samples. Each modem 254 may use the respective demodulator component to further demodulate or process the input samples (for example, for OFDM) to obtain received symbols. The MIMO detector 256 may obtain received symbols from the set of modems 254, may perform MIMO detection on the received symbols if applicable, and may provide detected symbols. The receive processor 258 may process (for example, decode) the detected symbols, may provide decoded data for the UE 120 to the data sink 260 (which may include a data pipeline, a data queue, and/or an application executed on the UE 120), and may provide decoded control information and system information to the controller/processor 280.

For uplink communication from the UE 120 to the network node 110, the transmit processor 264 may receive and process data ("uplink data") from a data source 262 (such as a data pipeline, a data queue, and/or an application executed on the UE 120) and control information from the controller/processor 280. The control information may include one or more parameters, feedback, one or more signal measurements, and/or other types of control information. In some aspects, the receive processor 258 and/or the controller/processor 280 may determine, for a received signal (such as received from the network node 110 or another UE), one or more parameters relating to transmission of the uplink communication. The one or more parameters may include a reference signal received power (RSRP) parameter, a received signal strength indicator (RSSI) parameter, a reference signal received quality (RSRQ) parameter, a CQI parameter, or a transmit power control (TPC) parameter, among other examples. The control information may include an indication of the RSRP parameter, the RSSI parameter, the RSRQ parameter, the CQI parameter, the TPC parameter, and/or another parameter. The control information may facilitate parameter selection and/or scheduling for the UE 120 by the network node 110.

The transmit processor 264 may generate reference symbols for one or more reference signals, such as an uplink DMRS, an uplink sounding reference signal (SRS), and/or another type of reference signal. The symbols from the transmit processor 264 may be precoded by the TX MIMO processor 266, if applicable, and further processed by the set of modems 254 (for example, for DFT-s-OFDM or CP-OFDM). The TX MIMO processor 266 may perform spatial processing (for example, precoding) on the data symbols, the control symbols, the overhead symbols, and/or the reference symbols, if applicable, and may provide a set of output symbol streams (for example, U output symbol streams) to the set of modems 254. For example, each output symbol stream may be provided to a respective modulator component (shown as MOD) of a modem 254. Each modem 254 may use the respective modulator component to process (for example, to modulate) a respective output symbol stream (for example, for OFDM) to obtain an output sample stream. Each modem 254 may further use the respective modulator component to process (for example, convert to analog, amplify, filter, and/or upconvert) the output sample stream to obtain an uplink signal.

The modems 254*a* through 254*u* may transmit a set of uplink signals (for example, R uplink signals or U uplink symbols) via the corresponding set of antennas 252. An uplink signal may include a UCI communication, a MAC-CE communication, an RRC communication, or another type of uplink communication. Uplink signals may be transmitted on a PUSCH, a PUCCH, and/or another type of uplink channel. An uplink signal may carry one or more TBs of data. Sidelink data and control transmissions (that is, transmissions directly between two or more UEs 120) may generally use similar techniques as were described for uplink data and control transmission, and may use sidelink-specific channels such as a physical sidelink shared channel (PSSCH), a physical sidelink control channel (PSCCH), and/or a physical sidelink feedback channel (PSFCH).

One or more antennas of the set of antennas 252 or the set of antennas 234 may include, or may be included within, one or more antenna panels, one or more antenna groups, one or more sets of antenna elements, or one or more antenna arrays, among other examples. An antenna panel, an antenna group, a set of antenna elements, or an antenna array may include one or more antenna elements (within a single housing or multiple housings), a set of coplanar antenna elements, a set of non-coplanar antenna elements, or one or more antenna elements coupled with one or more transmission or reception components, such as one or more components of FIG. 2. As used herein, "antenna" can refer to one or more antennas, one or more antenna panels, one or more antenna groups, one or more sets of antenna elements, or one or more antenna arrays. "Antenna panel" can refer to a group of antennas (such as antenna elements) arranged in an array or panel, which may facilitate beamforming by manipulating parameters of the group of antennas. "Antenna module" may refer to circuitry including one or more antennas, which may also include one or more other components (such as filters, amplifiers, or processors) associated with integrating the antenna module into a wireless communication device.

In some examples, each of the antenna elements of an antenna 234 or an antenna 252 may include one or more sub-elements for radiating or receiving radio frequency signals. For example, a single antenna element may include a first sub-element cross-polarized with a second sub-element that can be used to independently transmit cross-polarized signals. The antenna elements may include patch antennas, dipole antennas, and/or other types of antennas arranged in a linear pattern, a two-dimensional pattern, or another pattern. A spacing between antenna elements may be such that signals with a desired wavelength transmitted separately by the antenna elements may interact or interfere constructively and destructively along various directions (such as to form a desired beam). For example, given an expected range of wavelengths or frequencies, the spacing may provide a quarter wavelength, a half wavelength, or another fraction of a wavelength of spacing between neighboring antenna elements to allow for the desired constructive and destructive interference patterns of signals transmitted by the separate antenna elements within that expected range.

The amplitudes and/or phases of signals transmitted via antenna elements and/or sub-elements may be modulated and shifted relative to each other (such as by manipulating phase shift, phase offset, and/or amplitude) to generate one or more beams, which is referred to as beamforming. The term "beam" may refer to a directional transmission of a wireless signal toward a receiving device or otherwise in a desired direction. "Beam" may also generally refer to a direction associated with such a directional signal transmission, a set of directional resources associated with the signal transmission (for example, an angle of arrival, a horizontal direction, and/or a vertical direction), and/or a set of parameters that indicate one or more aspects of a directional signal, a direction associated with the signal, and/or a set of directional resources associated with the signal. In some implementations, antenna elements may be individually selected or deselected for directional transmission of a signal (or signals) by controlling amplitudes of one or more corresponding amplifiers and/or phases of the signal(s) to form one or more beams. The shape of a beam (such as the amplitude, width, and/or presence of side lobes) and/or the direction of a beam (such as an angle of the beam relative to a surface of an antenna array) can be dynamically controlled by modifying the phase shifts, phase offsets, and/or amplitudes of the multiple signals relative to each other.

Different UEs 120 or network nodes 110 may include different numbers of antenna elements. For example, a UE 120 may include a single antenna element, two antenna elements, four antenna elements, eight antenna elements, or a different number of antenna elements. As another example, a network node 110 may include eight antenna elements, 24 antenna elements, 64 antenna elements, 128 antenna elements, or a different number of antenna elements. Generally, a larger number of antenna elements may provide increased control over parameters for beam generation relative to a smaller number of antenna elements, whereas a smaller number of antenna elements may be less complex to implement and may use less power than a larger number of antenna elements. Multiple antenna elements may support multiple-layer transmission, in which a first layer of a communication (which may include a first data stream) and a second layer of a communication (which may include a second data stream) are transmitted using the same time and frequency resources with spatial multiplexing.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of the controller/processor 280.

Figure 3:
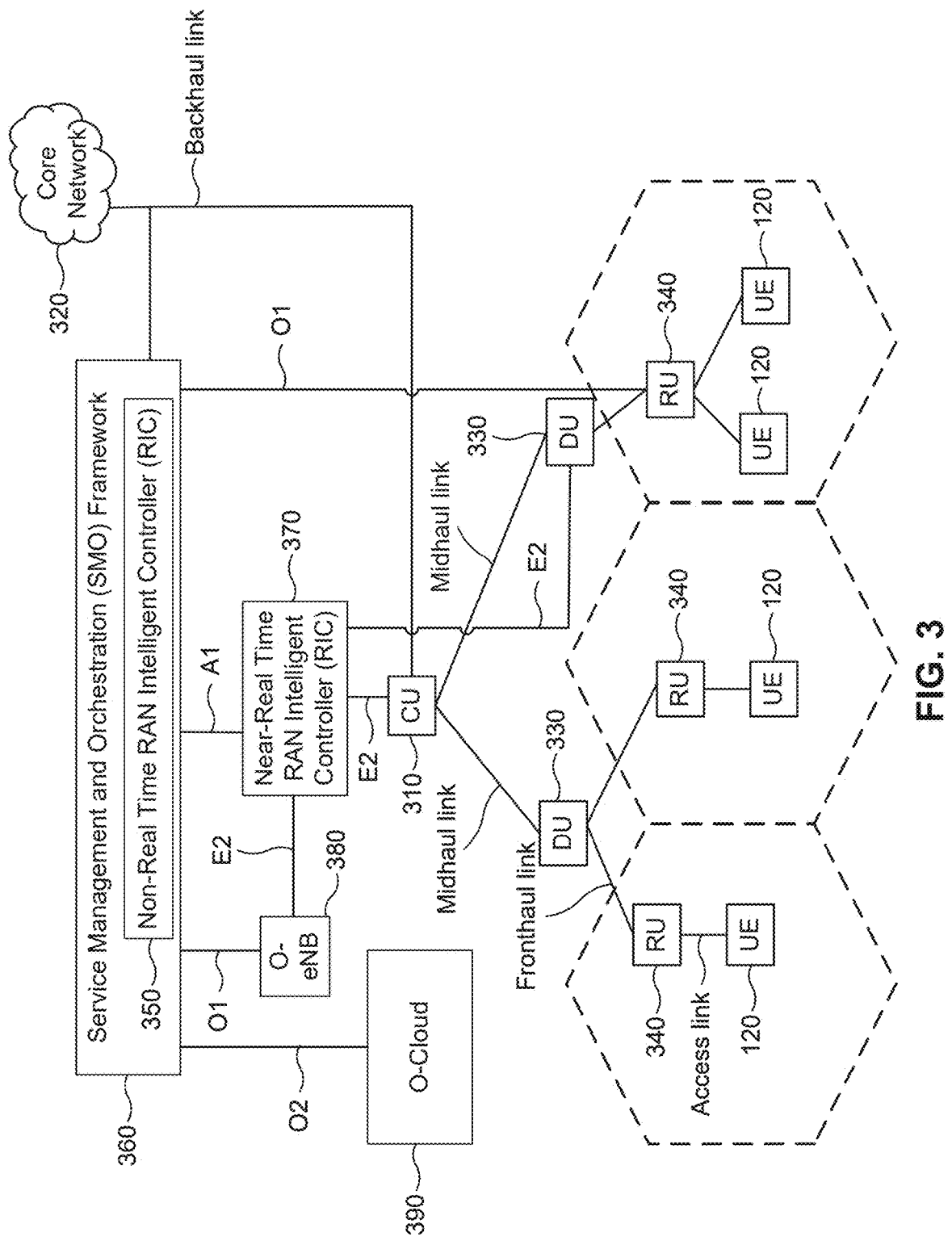
FIG. 3 is a diagram illustrating an example disaggregated base station architecture in accordance with the present disclosure.

FIG. 3 is a diagram illustrating an example disaggregated base station architecture 300 in accordance with the present disclosure. One or more components of the example disaggregated base station architecture 300 may be, may include, or may be included in one or more network nodes (such one or more network nodes 110). The disaggregated base station architecture 300 may include a CU 310 that can communicate directly with a core network 320 via a backhaul link, or that can communicate indirectly with the core network 320 via one or more disaggregated control units, such as a Non-RT RIC 350 associated with a Service Management and Orchestration (SMO) Framework 360 and/or a Near-RT RIC 370 (for example, via an E2 link). The CU 310 may communicate with one or more DUs 330 via respective midhaul links, such as via F1 interfaces. Each of the DUs 330 may communicate with one or more RUs 340 via respective fronthaul links. Each of the RUs 340 may communicate with one or more UEs 120 via respective RF access links. In some deployments, a UE 120 may be simultaneously served by multiple RUs 340.

Each of the components of the disaggregated base station architecture 300, including the CUs 310, the DUs 330, the RUs 340, the Near-RT RICs 370, the Non-RT RICs 350, and the SMO Framework 360, may include one or more interfaces or may be coupled with one or more interfaces for receiving or transmitting signals, such as data or information, via a wired or wireless transmission medium.

In some aspects, the CU 310 may be logically split into one or more CU user plane (CU-UP) units and one or more CU control plane (CU-CP) units. A CU-UP unit may communicate bidirectionally with a CU-CP unit via an interface, such as the E1 interface when implemented in an O-RAN configuration. The CU 310 may be deployed to communicate with one or more DUs 330, as necessary, for network control and signaling. Each DU 330 may correspond to a logical unit that includes one or more base station functions to control the operation of one or more RUs 340. For example, a DU 330 may host various layers, such as an RLC layer, a MAC layer, or one or more PHY layers, such as one or more high PHY layers or one or more low PHY layers. Each layer (which also may be referred to as a module) may be implemented with an interface for communicating signals with other layers (and modules) hosted by the DU 330, or for communicating signals with the control functions hosted by the CU 310. Each RU 340 may implement lower layer functionality. In some aspects, real-time and non-real-time aspects of control and user plane communication with the RU(s) 340 may be controlled by the corresponding DU 330.

The SMO Framework 360 may support RAN deployment and provisioning of non-virtualized and virtualized network elements. For non-virtualized network elements, the SMO Framework 360 may support the deployment of dedicated physical resources for RAN coverage requirements, which may be managed via an operations and maintenance interface, such as an O1 interface. For virtualized network elements, the SMO Framework 360 may interact with a cloud computing platform (such as an open cloud (O-Cloud) platform 390) to perform network element life cycle management (such as to instantiate virtualized network elements) via a cloud computing platform interface, such as an O2 interface. A virtualized network element may include, but is not limited to, a CU 310, a DU 330, an RU 340, a non-RT RIC 350, and/or a Near-RT RIC 370. In some aspects, the SMO Framework 360 may communicate with a hardware aspect of a 4G RAN, a 5G NR RAN, and/or a 6G RAN, such as an open eNB (O-eNB) 380, via an O1 interface. Additionally or alternatively, the SMO Framework 360 may communicate directly with each of one or more RUs 340 via a respective O1 interface. In some deployments, this configuration can enable each DU 330 and the CU 310 to be implemented in a cloud-based RAN architecture, such as a vRAN architecture.

The Non-RT RIC 350 may include or may implement a logical function that enables non-real-time control and optimization of RAN elements and resources, AI/ML workflows including model training and updates, and/or policy-based guidance of applications and/or features in the Near-RT RIC 370. The Non-RT RIC 350 may be coupled to or may communicate with (such as via an A1 interface) the Near-RT RIC 370. The Near-RT RIC 370 may include or may implement a logical function that enables near-real-time control and optimization of RAN elements and resources via data collection and actions via an interface (such as via an E2 interface) connecting one or more CUs 310, one or more DUs 330, and/or an O-eNB with the Near-RT RIC 370.

In some aspects, to generate AI/ML models to be deployed in the Near-RT RIC 370, the Non-RT RIC 350 may receive parameters or external enrichment information from external servers. Such information may be utilized by the Near-RT RIC 370 and may be received at the SMO Framework 360 or the Non-RT RIC 350 from non-network data sources or from network functions. In some examples, the Non-RT RIC 350 or the Near-RT RIC 370 may tune RAN behavior or performance. For example, the Non-RT RIC 350 may monitor long-term trends and patterns for performance and may employ AI/ML models to perform corrective actions via the SMO Framework 360 (such as reconfiguration via an O1 interface) or via creation of RAN management policies (such as A1 interface policies).

As indicated above, FIG. 3 is provided as an example. Other examples may differ from what is described with regard to FIG. 3.

The network node 110, the controller/processor 240 of the network node 110, the UE 120, the controller/processor 280 of the UE 120, the CU 310, the DU 330, the RU 340, or any other component(s) of FIG. 1, 2, or 3 may implement one or more techniques or perform one or more operations associated with single-index parity checking, as described in more detail elsewhere herein. For example, the controller/processor 240 of the network node 110, the controller/processor 280 of the UE 120, any other component(s) of FIG. 2, the CU 310, the DU 330, or the RU 340 may perform or direct operations of, for example, process 700 of FIG. 7, process 600 of FIG. 6, or other processes as described herein (alone or in conjunction with one or more other processors). The memory 242 may store data and program codes for the network node 110, the network node 110, the CU 310, the DU 330, or the RU 340. The memory 282 may store data and program codes for the UE 120. In some examples, the memory 242 or the memory 282 may include a non-transitory computer-readable medium storing a set of instructions (for example, code or program code) for wireless communication. The memory 242 may include one or more memories, such as a single memory or multiple different memories (of the same type or of different types). The memory 282 may include one or more memories, such as a single memory or multiple different memories (of the same type or of different types). For example, the set of instructions, when executed (for example, directly, or after compiling, converting, or interpreting) by one or more processors of the network node 110, the UE 120, the CU 310, the DU 330, or the RU 340, may cause the one or more processors to perform process 600 of FIG. 6, process 700 of FIG. 7, or other processes as described herein. In some examples, executing instructions may include running the instructions, converting the instructions, compiling the instructions, and/or interpreting the instructions, among other examples.

In some aspects, a wireless communication device includes means for encoding a message using a polar encoding operation to generate an encoded communication, wherein the encoded communication includes one or more parity check symbols, wherein each parity check symbol of the one or more parity check symbols is derived from a respective single symbol of the encoded communication; and/or means for transmitting the encoded communication. In some aspects, the means for the wireless communication device to perform operations described herein may include, for example, one or more of communication manager 150, transmit processor 214, TX MIMO processor 216, modem 232, antenna 234, MIMO detector 236, receive processor 238, controller/processor 240, memory 242, or scheduler 246. In some aspects, the means for the wireless communication device to perform operations described herein may include, for example, one or more of communication manager 140, antenna 252, modem 254, MIMO detector 256, receive processor 258, transmit processor 264, TX MIMO processor 266, controller/processor 280, or memory 282.

In some aspects, a wireless communication device includes means for receiving an encoded communication; and/or means for decoding the encoded communication to obtain a message, wherein the encoded communication includes one or more parity check symbols, wherein each parity check symbol of the one or more parity check symbols is derived from a respective single symbol of the encoded communication. In some aspects, the means for the wireless communication device to perform operations described herein may include, for example, one or more of communication manager 150, transmit processor 214, TX MIMO processor 216, modem 232, antenna 234, MIMO detector 236, receive processor 238, controller/processor 240, memory 242, or scheduler 246. In some aspects, the means for the wireless communication device to perform operations described herein may include, for example, one or more of communication manager 140, antenna 252, modem 254, MIMO detector 256, receive processor 258, transmit processor 264, TX MIMO processor 266, controller/processor 280, or memory 282.

As indicated above, FIG. 3 is provided as an example. Other examples may differ from what is described with regard to FIG. 3.

Figure 4:
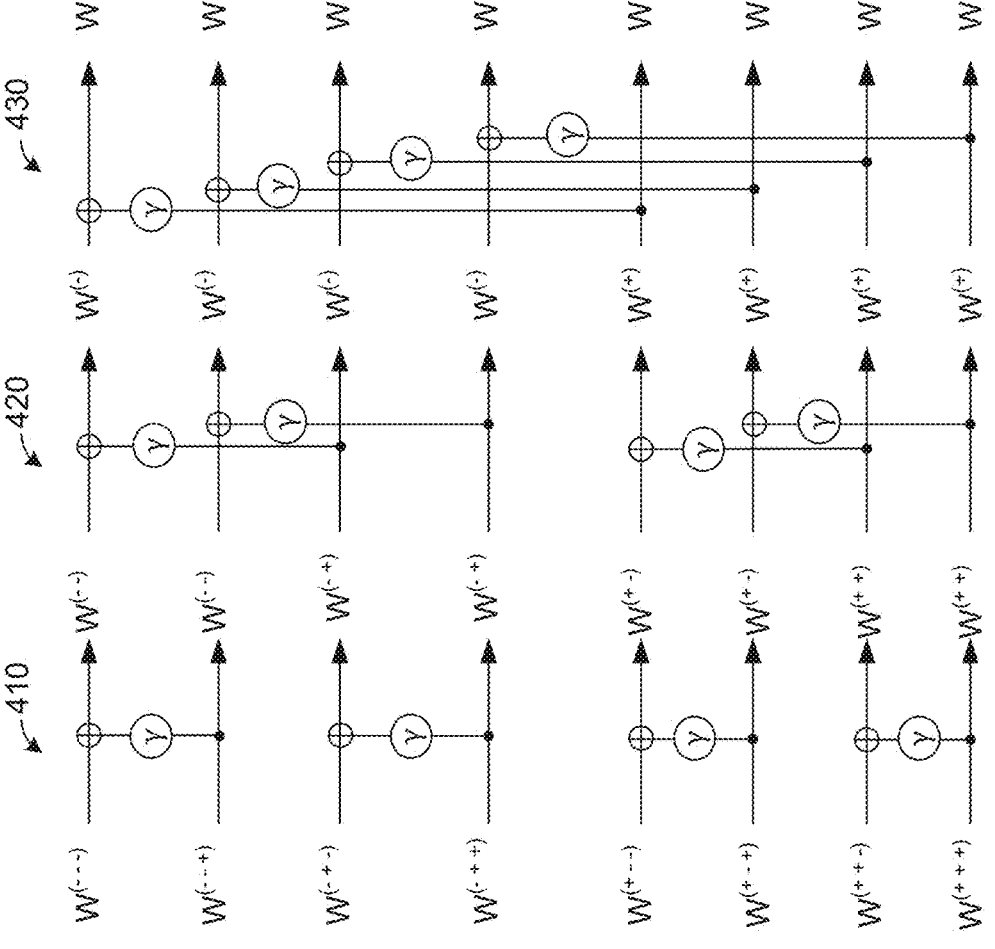
FIG. 4 is a diagram illustrating an example of a polar coding operation, in accordance with the present disclosure.

FIG. 4 is a diagram illustrating an example of a polar coding operation 400, in accordance with the present disclosure.

Wireless communications may be encoded using polar coding to improve resilience to non-ideal channel conditions. Polar encoding may involve constructing a codeword c having a length N. In some examples, encoding with an $(N=2^m, K)$ code defined over a Galois Field (GF) with four elements (GF(4)), the codeword $$c = u\begin{pmatrix} 1 & 0 \\ \gamma & 1 \end{pmatrix}^{\otimes m},$$

where $u_i$, $c_i \in GF(4)$ and $\gamma$ is an element of GF(4) not equal to 0 or 1. A symbol $u_i$ of an encoded communication may carry information (e.g., a two-bit payload in GF(4) or a one-bit payload in GF(2)) or may be frozen (e.g., having a fixed value, such as $u_i=0$). N may be referred to herein as a value defining a plurality of symbols of the encoded communication. In the binary case (GF(2)), $\gamma=1$.

The matrix $$\begin{pmatrix} 1 & 0 \\ \gamma & 1 \end{pmatrix}^{\otimes m}$$

may polarize $2^m$ copies of a channel W into subchannels $W^{(i)}$, which may be almost noisy (e.g., $I(W^{(i)}) \rightarrow 0$) or almost noiseless (e.g., $I(W^{(i)}) \rightarrow 2$). As an example, subchannels $W^{(i)}$ may be polarized into highly reliable (e.g., low noise) subchannels $W^{(i)}$ and highly unreliable (e.g., noisy) subchannels $W^{(i)}$. For example, for GF(4), the capacities of the subchannels $W^{(i)}$, $I(W^{(i)})$, may approach two for highly reliable subchannels $W^{(i)}$ and 0 for highly unreliable subchannels $W^{(i)}$. If GF(2), $\gamma=1$, and subchannels $W^{(i)}$ may be present where the capacities $I(W^{(i)})$ approach one (e.g., $I(W^{(i)}) \rightarrow 1$).

Polar coding provides for a set of information symbols $i_0, \ldots i_{K-1}$ to be mapped to reliable symbol positions (referred to as information locations) and for unreliable symbols (in frozen locations) to be replaced with frozen symbols. For example, the information symbols $i_0, \ldots i_{K-1}$ may correspond to the K largest capacities $I(W^{(i)})$. For example, a transmitter may transmit the information symbols $i_0, \ldots i_{K-1}$ through the subchannels $W^{(i)}$ that have the K largest capacities $I(W^{(i)})$.

The polar encoding operation 400 may include coupling a plurality of subchannels $W^{(i)}$ over multiple phases 410-430. Phase 410 involves coupling neighboring subchannels $W^{(i)}$. Phase 420 involves coupling subchannels $W^{(i)}$ separated by one subchannel $W^{(i)}$. Phase 430 involves coupling subchannels $W^{(i)}$ separated by three subchannels $W^{(i)}$. Polar decoding may involve performing the polar encoding operation 400 in reverse (e.g., phase 430, followed by phase 420, followed by phase 410).

Polar coding is described herein with reference to a general kernel $$G = \begin{pmatrix} 1 & 0 \\ \gamma & 1 \end{pmatrix},$$

where for GF(4), $\gamma \in \{1, \alpha, \alpha^2\}$, and $\alpha$ is the primitive element of GF($2^2$). Thus, the elements of GF($2^2$) may include $\{0, 1, \alpha, \alpha^2=\alpha+1\}$, which may be considered as the elements $\{00, 01, 10, 11\}$ of a two-dimensional vector space over GF(2). The summation of the elements may be defined coordinate-wise (e.g., where each coordinate is a single bit), and for multiplication of the elements, the following properties may be used: $0 \cdot x=0$, $1 \cdot x=x$, and $\alpha^3=1$. As described herein, for encoding in nonbinary polar coding, a recursive structure $$\begin{pmatrix} 1 & 0 \\ \gamma & 1 \end{pmatrix}^{\otimes m}$$

may be used. For GF(2), the general kernel $$G = \begin{pmatrix} 1 & 0 \\ 1 & 1 \end{pmatrix}$$

and for encoding in binary polar coding, a recursive structure $$\begin{pmatrix} 1 & 0 \\ 1 & 1 \end{pmatrix}^{\otimes m}$$

may be used.

As indicated above, FIG. 4 is provided as an example. Other examples may differ from what is described with respect to FIG. 4.

Figure 5:
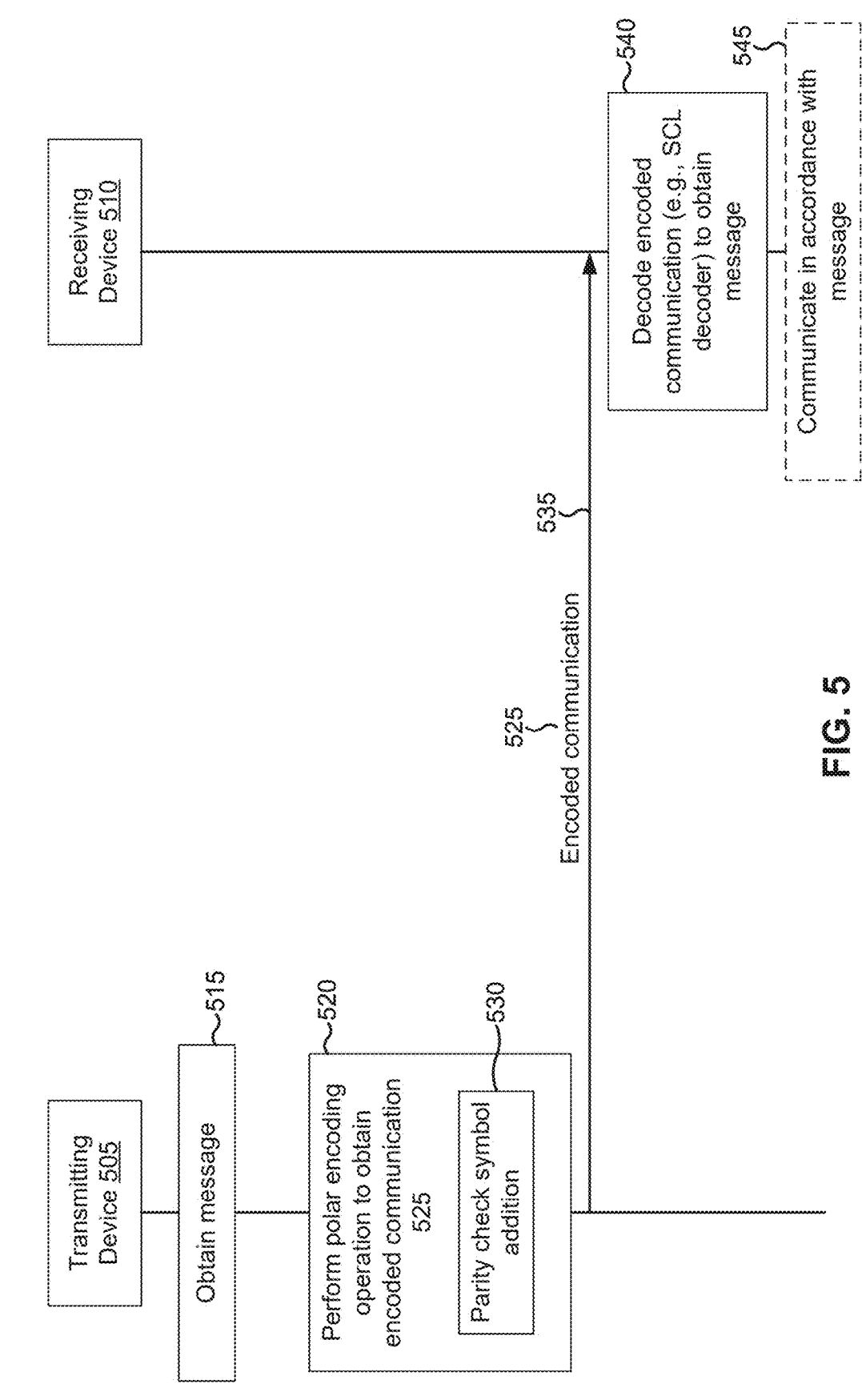
FIG. 5 is a diagram illustrating an example of polar encoding and decoding with single-index parity checking, in accordance with the present disclosure.

FIG. 5 is a diagram illustrating an example 500 of polar encoding and decoding with single-index parity checking, in accordance with the present disclosure. Example 500 includes a transmitting device 505 (e.g., UE 120, network node 110, RU 340, DU 330) and a receiving device 510 (e.g., UE 120, network node 110, RU 340, DU 330).

As shown by reference number 515, the transmitting device 505 may obtain a message. The message may include a plurality of symbols. In some aspects, each symbol of the plurality of symbols may include a respective bit. For example, the message may be a binary message (e.g., GF(2)). In some aspects, each symbol of the plurality of symbols may include multiple bits. For example, the message may be a non-binary message (e.g., GF(q), where q>2). In some aspects, the transmitting device 505 may obtain the message in a binary form and may convert the message to a non-binary form. In some aspects, the transmitting device may obtain the message in a non-binary form and may convert the message to a binary form.

As shown, the transmitting device 505 may perform a polar encoding operation 520 to obtain an encoded communication 525. The polar encoding operation 520 may include any one or more operations described with regard to polar encoding operation 400. The polar encoding operation 520 may include a binary polar coding operation (e.g., GF(2)) or a non-binary polar coding operation (e.g., GF(q), where q>2). Thus, the encoded communication 525 may include information symbols u, which can be binary symbols (e.g., GF(2)) or non-binary symbols (e.g., GF(q)).

As shown, as part of or in connection with the polar encoding operation 520, the transmitting device 505 may perform parity check symbol addition 530 using a single-index constraint. Thus, the encoded communication 525 may include one or more parity check symbols $u_i$, where i denotes an index of a given parity check symbol. As mentioned above, the single-index constraint may mean that each parity check symbol $u_i$ with index i is derived from (e.g., equal to) a single corresponding symbol $u_j$ with index j (though it should be noted that different parity check symbols $u_i$ may be derived from different symbols $u_j$). In some examples, for a parity check symbol with index i and a corresponding symbol with index j, $u_i=u_1$. In some aspects, index j may be lower than index i, such that the single corresponding symbol occurs earlier than the corresponding parity check symbol in the encoded communication 525.

In some aspects, all frozen positions of the polar encoding operation 520, after a first information position of the polar encoding operation 520, may be used for parity check symbols. For example, all frozen symbols of the encoded communication 525, after a first information bit of the encoded communication 525, may be set to single-index parity check symbols.

In some aspects, an index i of a parity check symbol $u_i$ may be separated from an index j of a corresponding symbol $u_j$ by a shift, denoted X. The shift may be the same for each parity check symbol of the encoded communication 525. Thus, the shift may be referred to as a fixed shift. In some aspects, the shift may be an integer value. A shift of X may indicate that index j is equal to index i minus X. For example, a parity check symbol $u_i$ may be defined as $u_i=u_{i-X}$ with a fixed value of X across all parity check symbols of an encoded communication 525. In some aspects, the fixed value of X may apply across all encoded communications performed between the transmitting device 505 and the receiving device 510. In some aspects, X may be configured or indicated, for example, via RRC signaling, medium access control signaling, or downlink control information. In some aspects, X may be preconfigured, for example, in a wireless communication specification or by an operator or manufacturer associated with the transmitting device 505 and/or the receiving device 510.

In some aspects, the shift X (which may be an integer) may be co-prime with a value, denoted N or $2^m$ in FIG. 4 and which may be an integer, defining a plurality of symbols of the encoded communication 525. A first value is co-prime with a second value if the only positive integer that is a divisor of both the first value and the second value is 1. By using a shift X that is co-prime with N, performance is improved.

In some aspects, the encoded communication 525 may include a CRC. For example, the CRC may be used for error detection. In some aspects, the CRC may include a shortened CRC value. For example, the encoded communication 525 may include a CRC value with a CRC length that is derived only from a target false alarm rate (as opposed to a CRC value with a CRC length derived from the target false alarm rate and a list size of the decoder). This may be achievable, at least in part, because the single-index constraint and/or fixed shift provide for acceptable performance with best path selection, at the decoder, using a path metric (e.g., and not a CRC).

As shown by reference number 535, the transmitting device 505 may transmit, and the receiving device 510 may receive, the encoded communication 525. As shown by reference number 540, the receiving device 510 may decode the encoded communication 525, and may thus obtain the message shown by reference number 515. For example, the receiving device 510 may perform a decoding operation.

In some aspects, the decoding operation may include a successive cancellation list (SCL) decoding operation. In an SCL decoding operation, a decoder may traverse a decision tree in a recursive manner, making decisions at each node of the decision tree according to likelihoods of received symbols at each node. The decoder may maintain a list of multiple candidate solutions, corresponding to multiple paths, during the decoding operation. The list of multiple candidate solutions may include partial codewords and corresponding path metrics. The decoder may prune the list, according to a path metric, in accordance with a target size of the list.

In some aspects, the decoder may perform a CRC check using a CRC of the encoded communication 525. For example, the decoder may perform a CRC check for only a selected path, of multiple paths identified in the decoding operation. The decoder may select the path according to a path metric, as described below. By performing the CRC check only for the selected path, hardware implementation is simplified, relative to performing CRC checks for each path or candidate solution in the list. Furthermore, when the CRC check is performed only for the selected path, overhead and rate loss can be reduced by including fewer CRC symbols than if the CRC check is performed for each path or candidate solution in the list. Thus, the decoder may select a single path according to the path metric, and may perform the CRC check only for the selected single path, thereby determining a decoding success or failure. Furthermore, a length of the CRC may be determined according to a target false alarm rate (FAR), and may not depend on a list size, L, of the decoding operation. For example, the length of the CRC may be approximately log_2(FAR), as opposed to approximately (log_2(FAR)+log_2(L)) if the length of the CRC were dependent on the list size L.

In some aspects, the CRC may be computed using binary values. For example, if the message is a binary message and the encoded communication 525 uses non-binary polar coding, the CRC may be computed using binary values of the binary message before conversion to non-binary symbols. In some aspects, the CRC may be computed using non-binary values. For example, if the message is a binary message and the encoded communication 525 uses nonbinary polar coding, the CRC may be computed using non-binary values after conversion of the message to non-binary symbols.

As mentioned, the decoder may perform the decoding operation according to a path metric. The decoder may use a path metric to select a path. The path metric may be based on magnitudes of likelihood values for symbols of the encoded communication 525 (as defined, for example, by a log-likelihood ratio (LLR) for a binary symbol or a log probability mass function (LPMF) for a non-binary symbol). In some aspects, the decoder may determine or update the path metric. For example, in the binary domain, for a frozen symbol $u_i$ that does not carry a parity check symbol, the decoder may compute a corresponding LLR value $l_i$. If the corresponding LLR value is less than zero (or in some aspects, less than or equal to zero), the decoder may add a magnitude of the corresponding LLR value to a path metric. As another example, in the binary domain, for a parity check symbol $u_i$, the decoder may compute a corresponding LLR value $l_i$ and obtain a corresponding symbol $u_j$ from which the parity check symbol $u_i$ is derived. In some aspects, the decoder may add a magnitude of the corresponding LLR value to the path metric if the LLR value is less than zero (or in some aspects less than or equal to zero) and a value of the corresponding symbol $u_j$ is zero. Additionally, or alternatively, the decoder may add a magnitude of the corresponding LLR value to the path metric if the LLR value is greater than zero (or in some aspects greater than or equal to zero) and a value of the corresponding symbol $u_j$ is one. The sign of the LLR value for a symbol may correspond to a "hard" estimate of the symbol (where a negative sign corresponds to an estimate of 1 and a positive sign corresponds to an estimate of 0). An absolute value (magnitude) of the LLR value may provide an indication of reliability of this estimate. The value of the parity check symbol $u_i$ is defined by the previously decoded symbol $u_j$. Therefore, if the parity check symbol's computed LLR $l_i$ has the wrong sign, the decoder may add, to the path metric, a value (which may be considered a penalty) equal to an absolute value of $|l_i|$ which serves as a measure of a magnitude of the decoder's mistake. The decoder may select a best path according to path metrics of various paths. For example, the decoder may select a path with a lowest path metric (indicating a lowest magnitude or likelihood of error) as the best path.

As just one example of decoding an encoded communication 525, an encoded communication 525 in the binary domain may have N=8 symbols, and may include K=4 information symbols. Information locations may be at indexes I={3, 5, 6, 7}. Symbols $u_0$, $u_1$, and $u_2$ may be frozen symbols (in frozen locations), and symbol $u_4$ may be a parity check symbol derived from an information symbol at $u_3$. For frozen symbols $u_i$, $i \in \{0, 1, 2\}$ in the decoder, the decoder may compute a corresponding LLR value $l_i$, and if $l_i < 0$, may add $|l_i|$ to a corresponding path metric. For parity check symbol $u_4$, the decoder may compute a corresponding LLR value $l_i$ and may obtain a previously decoded value of $u_3$. If $l_4 < 0$ and $u_3 = 0$, the decoder may add $|l_4|$ to the corresponding path metric. Additionally, or alternatively, if $l_4 > 0$ and $u_3 = 1$, the decoder may add $|l_4|$ to the path metric.

As shown by reference number 545, in some aspects, the receiving device 510 may optionally communicate in accordance with the message. For example, the receiving device 510 may transmit an acknowledgment or negative acknowledgment of the message. As another example, the receiving device 510 may transmit or receive another communication to or from the transmitting device 505.

As indicated above, FIG. 5 is provided as an example. Other examples may differ from what is described with regard to FIG. 5.

Figure 6:
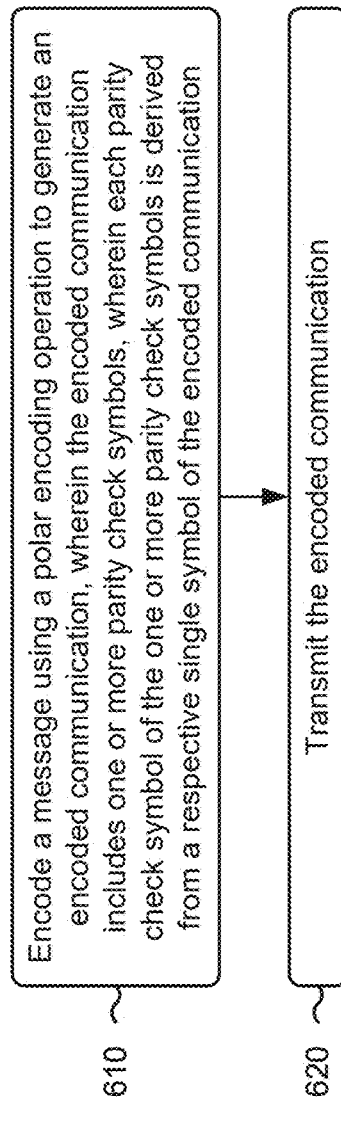
FIG. 6 is a diagram illustrating an example process performed, for example, at a wireless communication device or an apparatus of a wireless communication device, in accordance with the present disclosure.

FIG. 6 is a diagram illustrating an example process 600 performed, for example, at a wireless communication device or an apparatus of a wireless communication device, in accordance with the present disclosure. Example process 600 is an example where the apparatus or the wireless communication device (e.g., UE 120, network node 110, DU 330, RU 340, or transmitting device 505 of FIG. 5) performs operations associated with single-index parity checking for polar encoding.

As shown in FIG. 6, in some aspects, process 600 may include encoding a message using a polar encoding operation to generate an encoded communication, wherein the encoded communication includes one or more parity check symbols, wherein each parity check symbol of the one or more parity check symbols is derived from a respective single symbol of the encoded communication (block 610). For example, the wireless communication device (e.g., using communication manager 806, depicted in FIG. 8) may encode a message using a polar encoding operation to generate an encoded communication, wherein the encoded communication includes one or more parity check symbols, wherein each parity check symbol of the one or more parity check symbols is derived from a respective single symbol of the encoded communication, as described above.

As further shown in FIG. 6, in some aspects, process 600 may include transmitting the encoded communication (block 620). For example, the wireless communication device (e.g., using transmission component 804 and/or communication manager 806, depicted in FIG. 8) may transmit the encoded communication, as described above.

Process 600 may include additional aspects, such as any single aspect or any combination of aspects described below and/or in connection with one or more other processes described elsewhere herein.

In a first aspect, an index of a parity check symbol, of the one or more parity check symbols, is separated from an index of a corresponding single symbol of the encoded communication by a shift, wherein the shift is the same for all parity check symbols of the encoded communication.

In a second aspect, alone or in combination with the first aspect, a value of the shift is co-prime with a value defining a number of bits of the encoded communication.

In a third aspect, alone or in combination with one or more of the first and second aspects, each parity check symbol of the one or more parity check symbols is on a respective frozen location of the polar encoding operation.

In a fourth aspect, alone or in combination with one or more of the first through third aspects, all frozen locations of the polar encoding operation, that occur after a first information location of the polar encoding operation, are occupied by respective parity check symbols of the one or more parity check symbols.

In a fifth aspect, alone or in combination with one or more of the first through fourth aspects, the encoded communication includes a CRC value with a CRC length derived only from a false alarm rate.

In a sixth aspect, alone or in combination with one or more of the first through fifth aspects, the CRC value is independent of a list size of a decoder associated with the polar encoding operation.

Although FIG. 6 shows example blocks of process 600, in some aspects, process 600 may include additional blocks, fewer blocks, different blocks, or differently arranged blocks than those depicted in FIG. 6. Additionally, or alternatively, two or more of the blocks of process 600 may be performed in parallel.

Figure 7:
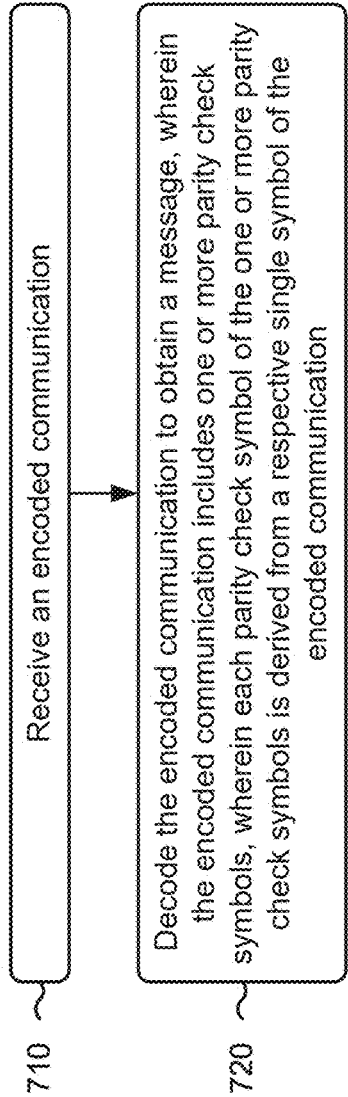
FIG. 7 is a diagram illustrating an example process performed, for example, at a wireless communication device or an apparatus of a wireless communication device, in accordance with the present disclosure.

FIG. 7 is a diagram illustrating an example process 700 performed, for example, at a wireless communication device or an apparatus of a wireless communication device, in accordance with the present disclosure. Example process 700 is an example where the apparatus or the wireless communication device (e.g., UE 120, network node 110, DU 330, RU 340, or the receiving device 510 of FIG. 5) performs operations associated with single-index parity checking for polar encoding.

As shown in FIG. 7, in some aspects, process 700 may include receiving an encoded communication (block 710). For example, the wireless communication device (e.g., using reception component 902 and/or communication manager 906) may receive an encoded communication, as described above.

As further shown in FIG. 7, in some aspects, process 700 may include decoding the encoded communication to obtain a message, wherein the encoded communication includes one or more parity check symbols, wherein each parity check symbol of the one or more parity check symbols is derived from a respective single symbol of the encoded communication (block 720). For example, the wireless communication device (e.g., using communication manager 906, depicted in FIG. 9) may decode the encoded communication to obtain a message, wherein the encoded communication includes one or more parity check symbols, wherein each parity check symbol of the one or more parity check symbols is derived from a respective single symbol of the encoded communication, as described above.

Process 700 may include additional aspects, such as any single aspect or any combination of aspects described below and/or in connection with one or more other processes described elsewhere herein.

In a first aspect, decoding the encoded communication comprises decoding a single symbol, and decoding a corresponding parity check symbol of the one or more parity check symbols using a value of the single symbol.

In a second aspect, alone or in combination with the first aspect, decoding the encoded communication comprises decoding the encoded communication using an SCL decoder.

In a third aspect, alone or in combination with one or more of the first and second aspects, decoding the encoded communication further comprises at least one of adding, for a first symbol in a frozen position of the encoded communication, a magnitude of a first LLR value of the first symbol to a path metric if the first LLR value is less than zero, or adding, for the parity check symbol, a magnitude of a second LLR value of the parity check symbol if the second LLR value is less than zero and a value of the single symbol is zero, or the second LLR value is greater than zero and the value of the single symbol is one.

In a fourth aspect, alone or in combination with one or more of the first through third aspects, an index of a parity check symbol, of the one or more parity check symbols, is separated from an index of a corresponding single symbol of the encoded communication by a shift, wherein the shift is the same for all parity check symbols of the encoded communication.

In a fifth aspect, alone or in combination with one or more of the first through fourth aspects, a value of the shift is co-prime with a value defining a number of bits of the encoded communication.

In a sixth aspect, alone or in combination with one or more of the first through fifth aspects, each parity check symbol of the one or more parity check symbols is on a respective frozen location of the polar encoding operation.

In a seventh aspect, alone or in combination with one or more of the first through sixth aspects, all frozen locations of the encoded communication, that occur after a first information location of the polar encoding operation, are associated with respective parity check symbols.

In an eighth aspect, alone or in combination with one or more of the first through seventh aspects, the encoded communication includes a CRC value.

In a ninth aspect, alone or in combination with one or more of the first through eighth aspects, the CRC value has a CRC length derived only from a false alarm rate.

In a tenth aspect, alone or in combination with one or more of the first through ninth aspects, the CRC value is independent of a list size used to decode the encoded communication.

In an eleventh aspect, alone or in combination with one or more of the first through tenth aspects, decoding the encoded communication further comprises selecting a path according to a path metric, and performing a CRC check for only the selected path using the CRC value.

Although FIG. 7 shows example blocks of process 700, in some aspects, process 700 may include additional blocks, fewer blocks, different blocks, or differently arranged blocks than those depicted in FIG. 7. Additionally, or alternatively, two or more of the blocks of process 700 may be performed in parallel.

Figure 8:
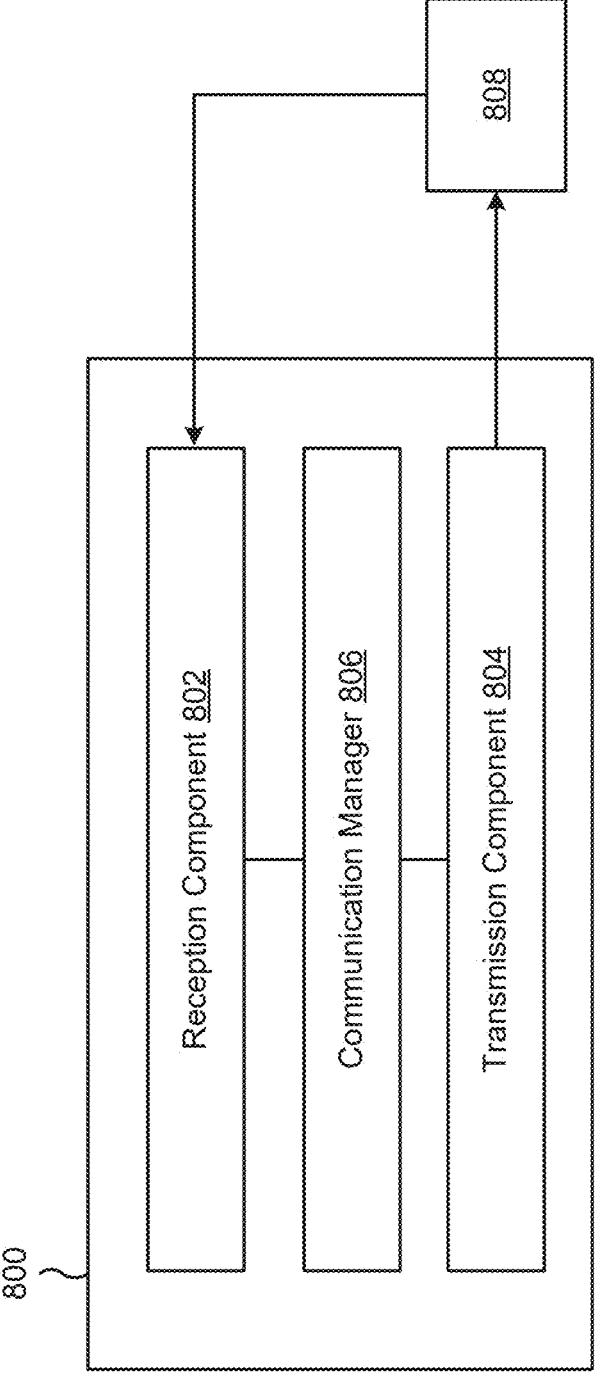
FIG. 8 is a diagram of an example apparatus for wireless communication, in accordance with the present disclosure.

FIG. 8 is a diagram of an example apparatus 800 for wireless communication, in accordance with the present disclosure. The apparatus 800 may be a wireless communication device, or a wireless communication device may include the apparatus 800. In some aspects, the apparatus 800 includes a reception component 802, a transmission component 804, and/or a communication manager 806, which may be in communication with one another (for example, via one or more buses and/or one or more other components). In some aspects, the communication manager 806 is the communication manager 140 described in connection with FIG. 1. As shown, the apparatus 800 may communicate with another apparatus 808, such as a UE or a network node (such as a CU, a DU, an RU, or a base station), using the reception component 802 and the transmission component 804.

In some aspects, the apparatus 800 may be configured to perform one or more operations described herein in connection with FIGS. 4 and 5. Additionally, or alternatively, the apparatus 800 may be configured to perform one or more processes described herein, such as process 600 of FIG. 6, or a combination thereof. In some aspects, the apparatus 800 and/or one or more components shown in FIG. 8 may include one or more components of the wireless communication device described in connection with FIG. 2. Additionally, or alternatively, one or more components shown in FIG. 8 may be implemented within one or more components described in connection with FIG. 2. Additionally, or alternatively, one or more components of the set of components may be implemented at least in part as software stored in one or more memories. For example, a component (or a portion of a component) may be implemented as instructions or code stored in a non-transitory computer-readable medium and executable by one or more controllers or one or more processors to perform the functions or operations of the component.

The reception component 802 may receive communications, such as reference signals, control information, data communications, or a combination thereof, from the apparatus 808. The reception component 802 may provide received communications to one or more other components of the apparatus 800. In some aspects, the reception component 802 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 800. In some aspects, the reception component 802 may include one or more antennas, one or more modems, one or more demodulators, one or more MIMO detectors, one or more receive processors, one or more controllers/processors, one or more memories, or a combination thereof, of the wireless communication device described in connection with FIG. 2.

The transmission component 804 may transmit communications, such as reference signals, control information, data communications, or a combination thereof, to the apparatus 808. In some aspects, one or more other components of the apparatus 800 may generate communications and may provide the generated communications to the transmission component 804 for transmission to the apparatus 808. In some aspects, the transmission component 804 may perform signal processing on the generated communications (such as filtering, amplification, modulation, digital-to-analog conversion, multiplexing, interleaving, mapping, or encoding, among other examples), and may transmit the processed signals to the apparatus 808. In some aspects, the transmission component 804 may include one or more antennas, one or more modems, one or more modulators, one or more transmit MIMO processors, one or more transmit processors, one or more controllers/processors, one or more memories, or a combination thereof, of the wireless communication device described in connection with FIG. 2. In some aspects, the transmission component 804 may be co-located with the reception component 802 in one or more transceivers.

The communication manager 806 may support operations of the reception component 802 and/or the transmission component 804. For example, the communication manager 806 may receive information associated with configuring reception of communications by the reception component 802 and/or transmission of communications by the transmission component 804. Additionally, or alternatively, the communication manager 806 may generate and/or provide control information to the reception component 802 and/or the transmission component 804 to control reception and/or transmission of communications.

The communication manager 806 may encode a message using a polar encoding operation to generate an encoded communication, wherein the encoded communication includes one or more parity check symbols, wherein each parity check symbol of the one or more parity check symbols is derived from a respective single symbol of the encoded communication. The transmission component 804 may transmit the encoded communication.

The number and arrangement of components shown in FIG. 8 are provided as an example. In practice, there may be additional components, fewer components, different components, or differently arranged components than those shown in FIG. 8. Furthermore, two or more components shown in FIG. 8 may be implemented within a single component, or a single component shown in FIG. 8 may be implemented as multiple, distributed components. Additionally, or alternatively, a set of (one or more) components shown in FIG. 8 may perform one or more functions described as being performed by another set of components shown in FIG. 8.

Figure 9:
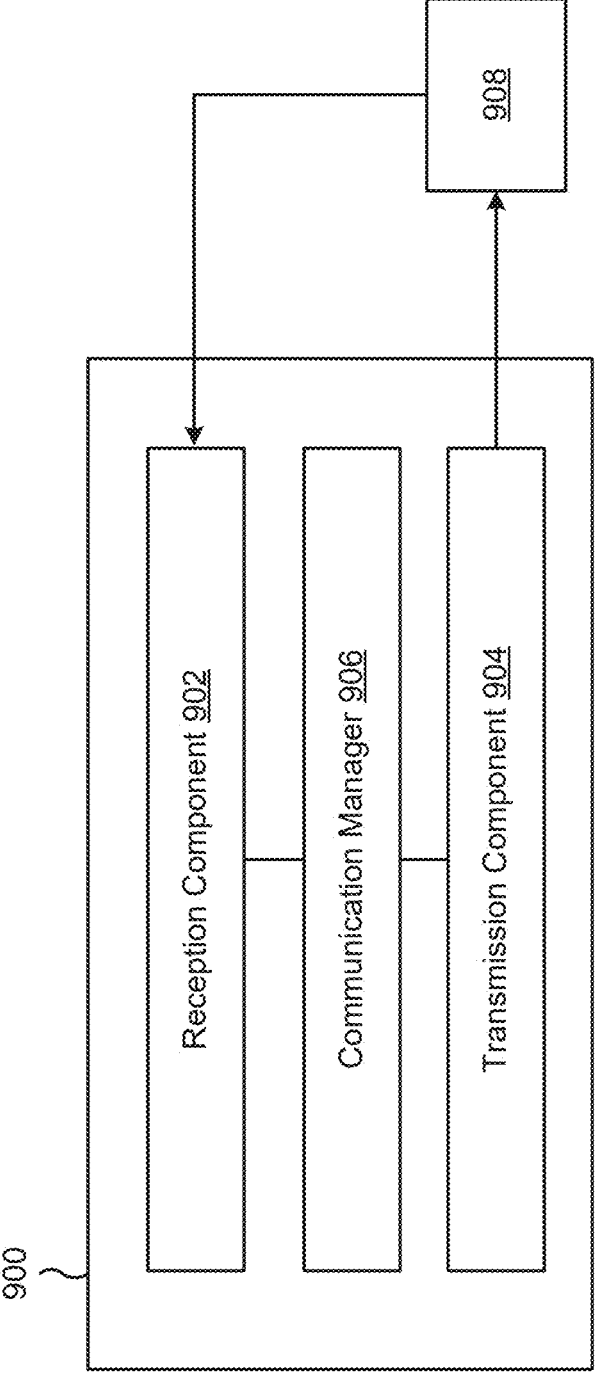
FIG. 9 is a diagram of an example apparatus for wireless communication, in accordance with the present disclosure.

FIG. 9 is a diagram of an example apparatus 900 for wireless communication, in accordance with the present disclosure. The apparatus 900 may be a wireless communication device, or a wireless communication device may include the apparatus 900. In some aspects, the apparatus 900 includes a reception component 902, a transmission component 904, and/or a communication manager 906, which may be in communication with one another (for example, via one or more buses and/or one or more other components). In some aspects, the communication manager 906 is the communication manager 150 described in connection with FIG. 1. As shown, the apparatus 900 may communicate with another apparatus 908, such as a UE or a network node (such as a CU, a DU, an RU, or a base station), using the reception component 902 and the transmission component 904.

In some aspects, the apparatus 900 may be configured to perform one or more operations described herein in connection with FIGS. 4 and 5. Additionally, or alternatively, the apparatus 900 may be configured to perform one or more processes described herein, such as process 700 of FIG. 7, or a combination thereof. In some aspects, the apparatus 900 and/or one or more components shown in FIG. 9 may include one or more components of the wireless communication device described in connection with FIG. 2. Additionally, or alternatively, one or more components shown in FIG. 9 may be implemented within one or more components described in connection with FIG. 2. Additionally, or alternatively, one or more components of the set of components may be implemented at least in part as software stored in one or more memories. For example, a component (or a portion of a component) may be implemented as instructions or code stored in a non-transitory computer-readable medium and executable by one or more controllers or one or more processors to perform the functions or operations of the component.

The reception component 902 may receive communications, such as reference signals, control information, data communications, or a combination thereof, from the apparatus 908. The reception component 902 may provide received communications to one or more other components of the apparatus 900. In some aspects, the reception component 902 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 900. In some aspects, the reception component 902 may include one or more antennas, one or more modems, one or more demodulators, one or more MIMO detectors, one or more receive processors, one or more controllers/processors, one or more memories, or a combination thereof, of the wireless communication device described in connection with FIG. 2.

The transmission component 904 may transmit communications, such as reference signals, control information, data communications, or a combination thereof, to the apparatus 908. In some aspects, one or more other components of the apparatus 900 may generate communications and may provide the generated communications to the transmission component 904 for transmission to the apparatus 908. In some aspects, the transmission component 904 may perform signal processing on the generated communications (such as filtering, amplification, modulation, digital-to-analog conversion, multiplexing, interleaving, mapping, or encoding, among other examples), and may transmit the processed signals to the apparatus 908. In some aspects, the transmission component 904 may include one or more antennas, one or more modems, one or more modulators, one or more transmit MIMO processors, one or more transmit processors, one or more controllers/processors, one or more memories, or a combination thereof, of the wireless communication device described in connection with FIG. 2. In some aspects, the transmission component 904 may be co-located with the reception component 902 in one or more transceivers.

The communication manager 906 may support operations of the reception component 902 and/or the transmission component 904. For example, the communication manager 906 may receive information associated with configuring reception of communications by the reception component 902 and/or transmission of communications by the transmission component 904. Additionally, or alternatively, the communication manager 906 may generate and/or provide control information to the reception component 902 and/or the transmission component 904 to control reception and/or transmission of communications.

The reception component 902 may receive an encoded communication. The communication manager 906 may decode the encoded communication to obtain a message, wherein the encoded communication includes one or more parity check symbols, wherein each parity check symbol of the one or more parity check symbols is derived from a respective single symbol of the encoded communication.

The number and arrangement of components shown in FIG. 9 are provided as an example. In practice, there may be additional components, fewer components, different components, or differently arranged components than those shown in FIG. 9. Furthermore, two or more components shown in FIG. 9 may be implemented within a single component, or a single component shown in FIG. 9 may be implemented as multiple, distributed components. Additionally, or alternatively, a set of (one or more) components shown in FIG. 9 may perform one or more functions described as being performed by another set of components shown in FIG. 9.

The following provides an overview of some Aspects of the present disclosure:

Aspect 1: A method of wireless communication performed by a wireless communication device, comprising: encoding a message using a polar encoding operation to generate an encoded communication, wherein the encoded communication includes one or more parity check symbols, wherein each parity check symbol of the one or more parity check symbols is derived from a respective single symbol of the encoded communication; and transmitting the encoded communication.

Aspect 2: The method of Aspect 1, wherein an index of a parity check symbol, of the one or more parity check symbols, is separated from an index of a corresponding single symbol of the encoded communication by a shift, wherein the shift is the same for all parity check symbols of the encoded communication.

Aspect 3: The method of Aspect 2, wherein a value of the shift is co-prime with a value defining a number of bits of the encoded communication.

Aspect 4: The method of any of Aspects 1-3, wherein each parity check symbol of the one or more parity check symbols is on a respective frozen location of the polar encoding operation.

Aspect 5: The method of Aspect 4, wherein all frozen locations of the polar encoding operation, that occur after a first information location of the polar encoding operation, are occupied by respective parity check symbols of the one or more parity check symbols.

Aspect 6: The method of any of Aspects 1-5, wherein the encoded communication includes a cyclic redundancy check (CRC) value with a CRC length derived only from a false alarm rate.

Aspect 7: The method of Aspect 6, wherein the CRC value is independent of a list size of a decoder associated with the polar encoding operation.

Aspect 8: A method of wireless communication performed by a wireless communication device, comprising: receiving an encoded communication; and decoding the encoded communication to obtain a message, wherein the encoded communication includes one or more parity check symbols, wherein each parity check symbol of the one or more parity check symbols is derived from a respective single symbol of the encoded communication.

Aspect 9: The method of Aspect 8, wherein decoding the encoded communication comprises: decoding a single symbol; and decoding a corresponding parity check symbol of the one or more parity check symbols using a value of the single symbol.

Aspect 10: The method of any of Aspects 8-9, wherein decoding the encoded communication comprises decoding the encoded communication using a successive cancellation list (SCL) decoder.

Aspect 11: The method of Aspect 10, wherein decoding the encoded communication further comprises at least one of: adding, for a first symbol in a frozen position of the encoded communication, a magnitude of a first log-likelihood ratio (LLR) value of the first symbol to a path metric if the first LLR value is less than zero; or adding, for the parity check symbol, a magnitude of a second LLR value of the parity check symbol if: the second LLR value is less than zero and a value of the single symbol is zero, or the second LLR value is greater than zero and the value of the single symbol is one.

Aspect 12: The method of Aspect 9, wherein an index of a parity check symbol, of the one or more parity check symbols, is separated from an index of a corresponding single symbol of the encoded communication by a shift, wherein the shift is the same for all parity check symbols of the encoded communication.

Aspect 13: The method of Aspect 12, wherein a value of the shift is co-prime with a value defining a number of bits of the encoded communication.

Aspect 14: The method of any of Aspects 8-13, wherein each parity check symbol of the one or more parity check symbols is on a respective frozen location of the polar encoding operation.

Aspect 15: The method of Aspect 14, wherein all frozen locations of the encoded communication, that occur after a first information location of the polar encoding operation, are associated with respective parity check symbols.

Aspect 16: The method of any of Aspects 8-15, wherein the encoded communication includes a cyclic redundancy check (CRC) value.

Aspect 17: The method of Aspect 16, wherein the CRC value has a CRC length derived only from a false alarm rate.

Aspect 18: The method of Aspect 16, wherein the CRC value is independent of a list size used to decode the encoded communication.

Aspect 19: The method of Aspect 16, wherein decoding the encoded communication further comprises: selecting a path according to a path metric; and performing a CRC check for only the selected path using the CRC value.

Aspect 20: An apparatus for wireless communication at a device, the apparatus comprising one or more processors; one or more memories coupled with the one or more processors; and instructions stored in the one or more memories and executable by the one or more processors to cause the apparatus to perform the method of one or more of Aspects 1-19.

Aspect 21: An apparatus for wireless communication at a device, the apparatus comprising one or more memories and one or more processors coupled to the one or more memories, the one or more processors configured to cause the device to perform the method of one or more of Aspects 1-19.

Aspect 22: An apparatus for wireless communication, the apparatus comprising at least one means for performing the method of one or more of Aspects 1-19.

Aspect 23: A non-transitory computer-readable medium storing code for wireless communication, the code comprising instructions executable by one or more processors to perform the method of one or more of Aspects 1-19.

Aspect 24: A non-transitory computer-readable medium storing a set of instructions for wireless communication, the set of instructions comprising one or more instructions that, when executed by one or more processors of a device, cause the device to perform the method of one or more of Aspects 1-19.

Aspect 25: A device for wireless communication, the device comprising a processing system that includes one or more processors and one or more memories coupled with the one or more processors, the processing system configured to cause the device to perform the method of one or more of Aspects 1-19.

Aspect 26: An apparatus for wireless communication at a device, the apparatus comprising one or more memories and one or more processors coupled to the one or more memories, the one or more processors individually or collectively configured to cause the device to perform the method of one or more of Aspects 1-19.

The foregoing disclosure provides illustration and description but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware or a combination of hardware and at least one of software or firmware. "Software" shall be construed broadly to mean instructions, instruction sets, code, code segments, program code, programs, subprograms, software modules, applications, software applications, software packages, routines, subroutines, objects, executables, threads of execution, procedures, or functions, among other examples, whether referred to as software, firmware, middleware, microcode, hardware description language, or otherwise. As used herein, a "processor" is implemented in hardware or a combination of hardware and software. It will be apparent that systems or methods described herein may be implemented in different forms of hardware or a combination of hardware and software. The actual specialized control hardware or software code used to implement these systems or methods is not limiting of the aspects. Thus, the operation and behavior of the systems or methods are described herein without reference to specific software code, because those skilled in the art will understand that software and hardware can be designed to implement the systems or methods based, at least in part, on the description herein. A component being configured to perform a function means that the component has a capability to perform the function, and does not require the function to be actually performed by the component, unless noted otherwise.

As used herein, "satisfying a threshold" may, depending on the context, refer to a value being greater than the threshold, greater than or equal to the threshold, less than the threshold, less than or equal to the threshold, equal to the threshold, or not equal to the threshold, among other examples.

As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (for example, a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or similar language is used. Also, as used herein, the terms "has," "have," "having," and similar terms are intended to be open-ended terms that do not limit an element that they modify (for example, an element "having" A may also have B). Further, the phrase "based on" is intended to mean "based on or otherwise in association with" unless explicitly stated otherwise. Also, as used herein, the term "or" is intended to be inclusive when used in a series and may be used interchangeably with "and/or," unless explicitly stated otherwise (for example, if used in combination with "either" or "only one of"). It should be understood that "one or more" is equivalent to "at least one."

Even though particular combinations of features are recited in the claims or disclosed in the specification, these combinations are not intended to limit the disclosure of various aspects. Many of these features may be combined in ways not specifically recited in the claims or disclosed in the specification. The disclosure of various aspects includes each dependent claim in combination with every other claim in the claim set.

What is claimed is:

1. An apparatus for wireless communication at a wireless communication device, comprising:

one or more memories; and one or more processors, coupled to the one or more memories, configured to cause the wireless communication device to:

encode a message using a polar encoding operation to generate an encoded communication, wherein the encoded communication includes one or more parity check symbols, wherein each parity check symbol of the one or more parity check symbols is derived from a respective single symbol of the encoded communication; and transmit the encoded communication;

wherein an index of a parity check symbol, of the one or more parity check symbols, is separated from an index of a corresponding single symbol of the encoded communication by a shift, wherein a same shift is used for all parity check symbols of the encoded communication;

wherein a value of the shift is co-prime with a value defining a number of bits of the encoded communication.

2. The apparatus of claim 1, wherein each parity check symbol of the one or more parity check symbols is on a respective frozen location of the polar encoding operation.

3. The apparatus of claim 2, wherein all frozen locations of the polar encoding operation, that occur after a first information location of the polar encoding operation, are occupied by respective parity check symbols of the one or more parity check symbols.

4. The apparatus of claim 1, wherein the encoded communication includes a cyclic redundancy check (CRC) value with a CRC length derived only from a false alarm rate.

5. The apparatus of claim 4, wherein the CRC value is independent of a list size of a decoder associated with the polar encoding operation.

6. An apparatus for wireless communication at a wireless communication device, comprising:

one or more memories; and one or more processors, coupled to the one or more memories, configured to cause the wireless communication device to:

receive an encoded communication; and decode the encoded communication to obtain a message, wherein the encoded communication includes one or more parity check symbols, wherein each parity check symbol of the one or more parity check symbols is derived from a respective single symbol of the encoded communication;

wherein an index of a parity check symbol, of the one or more parity check symbols, is separated from an index of a corresponding single symbol of the encoded communication by a shift, wherein the shift is the same for all parity check symbols of the encoded communication;

wherein a value of the shift is co-prime with a value defining a number of bits of the encoded communication.

7. The apparatus of claim 6, wherein the one or more processors, to cause the wireless communication device to decode the encoded communication, are configured to cause the wireless communication device to:

decode a single symbol; and decode a corresponding parity check symbol of the one or more parity check symbols using a value of the single symbol.

8. The apparatus of claim 6, wherein the one or more processors, to cause the wireless communication device to decode the encoded communication, are configured to cause the wireless communication device to decode the encoded communication using a successive cancellation list (SCL) decoder.

9. The apparatus of claim 8, wherein the one or more processors, to cause the wireless communication device to decode the encoded communication, are configured to cause the wireless communication device to:

add, for a first symbol in a frozen position of the encoded communication, a magnitude of a first log-likelihood ratio (LLR) value of the first symbol to a path metric if the first LLR value is less than zero; or add, for the parity check symbol, a magnitude of a second LLR value of the parity check symbol if:

the second LLR value is less than zero and a value of the single symbol is zero, or the second LLR value is greater than zero and the value of the single symbol is one.

10. The apparatus of claim 6, wherein each parity check symbol of the one or more parity check symbols is on a respective frozen location.

11. The apparatus of claim 10, wherein all frozen locations, that occur after a first information location of the encoded communication, are associated with respective parity check symbols.

12. The apparatus of claim 6, wherein the encoded communication includes a cyclic redundancy check (CRC) value.

13. The apparatus of claim 12, wherein the CRC value has a CRC length derived only from a false alarm rate.

14. The apparatus of claim 12, wherein the CRC value is independent of a list size used to decode the encoded communication.

15. The apparatus of claim 12, wherein the one or more processors, to cause the wireless communication device to decode the encoded communication, are configured to cause the wireless communication device to:

select a path according to a path metric; and perform a CRC check for only the selected path using the CRC value.

16. A method of wireless communication performed by a wireless communication device, comprising:

encoding a message using a polar encoding operation to generate an encoded communication, wherein the encoded communication includes one or more parity check symbols, wherein each parity check symbol of the one or more parity check symbols is derived from a respective single symbol of the encoded communication; and transmitting the encoded communication;

wherein an index of a parity check symbol, of the one or more parity check symbols, is separated from an index of a corresponding single symbol of the encoded communication by a shift, wherein the shift is the same for all parity check symbols of the encoded communication, wherein a value of the shift is co-prime with a value defining a number of bits of the encoded communication.

17. The method of claim 16, wherein each parity check symbol of the one or more parity check symbols is on a respective frozen location of the polar encoding operation.

18. The method of claim 17, wherein all frozen locations of the polar encoding operation, that occur after a first information location of the polar encoding operation, are occupied by respective parity check symbols of the one or more parity check symbols.

19. The method of claim 16, wherein the encoded communication includes a cyclic redundancy check (CRC) value with a CRC length derived only from a false alarm rate.

20. A method of wireless communication performed by a wireless communication device, comprising:

receiving an encoded communication; and decoding the encoded communication to obtain a message, wherein the encoded communication includes one or more parity check symbols, wherein each parity check symbol of the one or more parity check symbols is derived from a respective single symbol of the encoded communication;

wherein an index of a parity check symbol, of the one or more parity check symbols, is separated from an index of a corresponding single symbol of the encoded communication by a shift, wherein the shift is the same for all parity check symbols of the encoded communication;

wherein a value of the shift is co-prime with a value defining a number of bits of the encoded communication.

21. The method of claim 20, wherein decoding the encoded communication comprises:

decoding a single symbol; and decoding a corresponding parity check symbol of the one or more parity check symbols using a value of the single symbol.

22. The method of claim 20, wherein decoding the encoded communication comprises decoding the encoded communication using a successive cancellation list (SCL) decoder.

23. The method of claim 22, wherein decoding the encoded communication further comprises at least one of:

adding, for a first symbol in a frozen position of the encoded communication, a magnitude of a first log-likelihood ratio (LLR) value of the first symbol to a path metric if the first LLR value is less than zero; or adding, for the parity check symbol, a magnitude of a second LLR value of the parity check symbol if:

the second LLR value is less than zero and a value of the single symbol is zero, or the second LLR value is greater than zero and the value of the single symbol is one.

\* \* \* \* \*